United States Patent [19]
Schulz

[11] 4,019,049
[45] Apr. 19, 1977

[54] PHOTOELECTRIC TRANSDUCING UNIT AND SYSTEM FOR DETECTING THE SHARPNESS OF THE IMAGE OF OBJECT BY MEANS OF THE UNIT

[76] Inventor: Hansrichard Schulz, Obere Walstrasse 2a, D-773 Villingen, Black Forest, Germany

[22] Filed: Jan. 30, 1975

[21] Appl. No.: 545,473

[30] Foreign Application Priority Data
Feb. 8, 1974 Germany .......................... 2406045

[52] U.S. Cl. .......................... 250/211 R; 250/201; 354/25
[51] Int. Cl.² .......................... H01J 39/12
[58] Field of Search .............. 250/201, 204, 211 R, 250/211 J; 354/162, 163, 195, 25

[56] References Cited
UNITED STATES PATENTS

| | | | |
|---|---|---|---|
| 3,830,571 | 8/1974 | Imai et al. | 250/201 |
| 3,838,275 | 9/1974 | Stauffer | 250/204 |
| 3,857,031 | 12/1974 | Sinclair et al. | 250/201 |
| 3,875,401 | 4/1975 | Stauffer | 354/195 |

*Primary Examiner*—David C. Nelms

[57] ABSTRACT

One bifilarly deposited photosensitive strip provided with electrodes on the ends, and a second bifilarly deposited photosensitive strip, contacted along its long edges by two electrodes, are disposed on opposite side of a transparent spacer to form a focusing indicator. When one or more indicators are mounted at suitable locations in an optical system, suitable circuit means respond to the electrical output at the electrodes and respond to the optical system position. Indication may be accomplished by responding to the circuit means.

65 Claims, 34 Drawing Figures

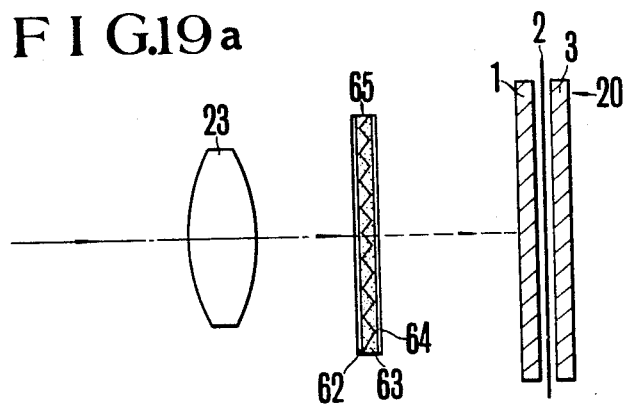
FIG.19a
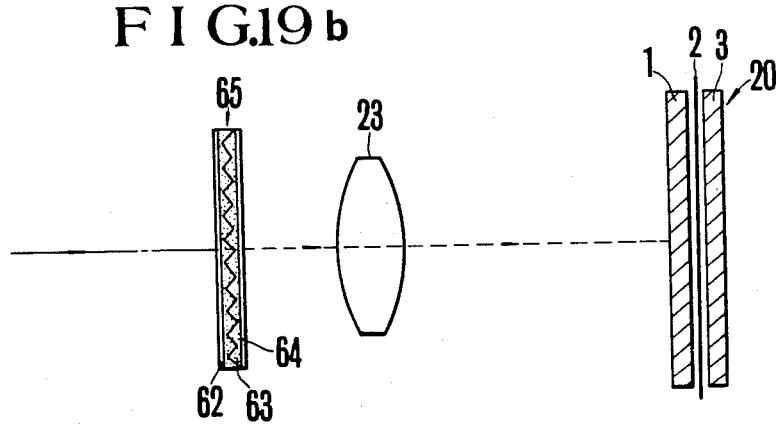
FIG.19b
FIG.20
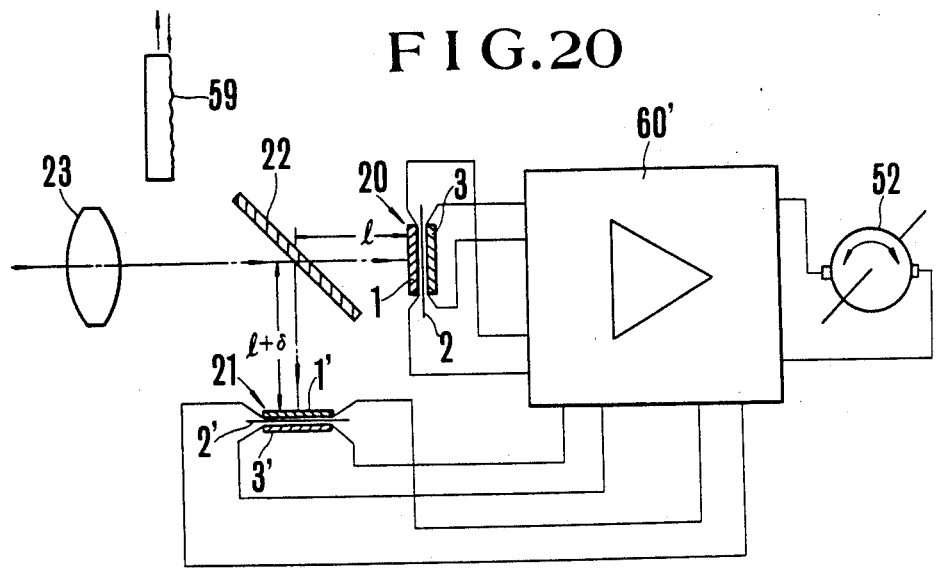

PHOTOELECTRIC TRANSDUCING UNIT AND SYSTEM FOR DETECTING THE SHARPNESS OF THE IMAGE OF OBJECT BY MEANS OF THE UNIT

BACKGROUND OF THE INVENTION

1. Field of the Invention

The present invention relates to a photoelectric transducing unit and a system for detecting the sharpness of the image of object by means of the unit, more particularly to the disposition of a photoelectric transducer in the photoelectric transducing unit consisting of at least two photoelectric transducers whose output characteristics are different from each other and whose photosensitive layers preferably exist in the same image forming plane as well as to a system for detecting the sharpness of the image of object by means of the photoelectric transducing unit, especially to a system adequate for the focus detection and/or the automatic focus adjustment in the optical instrument presenting an image forming optics.

2. Description of the Prior Art

For example in the conventional disposition of the two photoelectric transducers reacting to the contrast of the image formed by an image forming optics it is requested that a semipermeable light beam splitter should be disposed in the optical path between the objective lens and the photoconductive layers of the photoelectric transducers in such a manner that the light beam coming through the objective lens and reflected by means of the light beam splitter should reach the first photoelectric transducers while the light beam coming through the objective lens and passing through the light beam splitter should reach the second photoelectric transducer. Hereby the photosensitive layers of the both photoelectric transducers are generally disposed in the image planes of the two images formed by the light beams projected by means of the objective lens and splitted by means of the light beam splitter.

For this kind of disposition such disposition has already been known that the one photoelectric transducer is composed of for example, photosensitive layer zones connected in series (series type photoelectric transducer) while the other photoelectric transducer is composed of for example, photosensitive layer zones connected in parallel (parallel type photoelectric transducer). In this kind of disposition, by connecting these photoelectric transducers in for example, a proper bridge circuit it is possible to obtain a signal which assumes a limit value when the contrast of the fine parts of an image is maximum, namely the image planes correspond with the photosensitive layers of the photoelectrical transducers.

However, this kind of disposition is not only expensive but also needs a comparatively large space as well as a fine careful adjustment. In view of the fact that two sets of a pair of this kind of photoelectric transducers are needed in order to automatically adjust the focussing of an objective lens not presenting a movable part together with the direction of the objective lens, the disposition of at least three semipermeable light beam splitters presenting four photoelectric transducers to be adjusted very carefully becomes remarkably complicated.

The space hereby needed would be large in size out of discussion as compared with the ordinary size of the camera of today.

In case a pair of this kind of the photoelectric transducers presenting a semipermeable light beam splitter is adopted for the automatic focus adjustment of the image forming optics, the mechanical vibration becomes necessary for the photoelectric transducers or the auxiliary reflecting body or the prism disposed in the optical path of the optics with the result that in this case also the problem about the necessary space and the adjustment takes place.

On the other hand when a passive automatic focus adjustment equipment or a focus detecting equipment for an optical instrument such as camera by making use of such photoelectric transducers as mentioned above it is requested that the equipment should operate with sureness over a wide range of the brightness covering several ten times. What is at first to be solved basically is the problem as to how to stabilize the initial value of the measured value disturbed by the variation of the offset voltage of the amplifier for amplifying the signals to be measured or the noise output due to the constructional difference of the photoelectric transducers themselves.

Namely, the signal voltage generatd by the photoelectric transducers reacting to the contrast of the image is necessarily small as the level of the intensity to be measured (due to the non-linear effect) especially in case the contrast of the image is low, a comparatively high amplification becomes necessary. However, a desirable effect of such a high amplification as mentioned above can be expected much of only when a signal with sufficiently high S/N ratio (ratio of signal to noise) is put in the amplifier, namely the above mentioned noise voltage is sufficiently small (at least −20db) as compared with the signal voltage to be measured which is thought the effective signal, so that the above mentioned problem as to how to stabilize the initial value of the intensity to be measured should be solved basically.

SUMMARY OF THE INVENTION

One of the objects of the present invention is to offer a very compact photoelectrical transducing unit consisting of two or more than two photoelectric transducers and presenting a disposition very easy to adjust.

Another object of the present invention is to offer a photoelectric transducing unit capable of detecting the sharpness of an image with high accuracy by combining two photoelectric transducers presenting different output characteristics from each other.

Further another object of the present invention is to offer a photoelectric transducing unit with a combined disposition of a series type photoelectric transducer and a parallel type photoelectric transducer, whereby their output characteristics are different from each other.

Further another object of the present invention is to compose a photoelectrical transducing unit by combining two photoelectric transducers presenting a bifilar-spiral construction in the photosensitive layers and the electrodes.

Further another object of the present invention is to compose a photoelectric transducing unit, by combining a series type photoelectric transducer consisting of a photosensitive layer of a fine, long, belt-shaped, bifilar-spirally wound photoelectric semiconductor and of electrodes provided at both ends of the belt-shaped photoelectric conductor and a parallel type photoelectric transducer consisting of counter electrodes of two fine, long, belt-shaped, bifilar-spirally wound conductor pieces and of a photosensitive layer of photoelectrical semiconductor electrically connected with the counter electrode in such a manner that the counter electrodes in the parallel type photoelectric transducer do not overlap the photosensitive layer in the series type photoelectrical transducer.

Further, another object of the present invention is to compose a photoelectrical transducing unit, by combining a series type photoelectric transducer consisting of a photosensitive layer of a fine, long, belt-shaped, bifilar-spirally wound photoelectric semiconductor and of electrodes provided at both ends of the belt-shaped photoelectric semiconductor and a parallel type photoelectric transducer consisting of counter electrodes of two fine, long, belt-shaped, bifilar-spirally wound conductor pieces and of a photosensitive layer of photoelectric semiconductor electrically connected with the counter electrodes in such a manner that the photosensitive layer in the series type photoelectric transducer overlaps the counter electrodes in the parallel type photoelectrical transducer.

Further, another object of the present invention is to compose a photoelectrical transducing unit of two photoelectrical transducers (photosensitive elements) in such a manner that the light beam directly reaches the one (front side) photoelectric transducer, passes the permeable zone of the (front side) photoelectrical transducer and reaches the photosensitive layer of the other (back side) photoelectrical transducer.

The further another purpose of the present invention is to offer a combination of the two sets of the photoelectrical transducing units with highest permeability shifted by ±δ/2 to the optical axis for the position where the resolving power is maximum, without the light beam splitting by means of a semipermeable light beam splitting means or a prism, disposed optically in continuation and enabling a differential disposition necessary for the automatic focussing by means of the photoelectrical transducers reacting to the contrast.

Further another object of the present invention is to offer a system for detecting the sharpness of the image of object by means of a or more than one above mentioned photoelectric transducing units.

Further another object of the present invention is to apply the above mentioned system for detecting the sharpness of the image of object to the focus detecting equipment and/or the automatic focus adjusting equipment for the optical instrument such as photographing camera, motion picture camera and so on.

Further other object of the present invention will be disclosed in the following explanation according to the accompanying drawings.

BRIEF DESCRIPTION OF THE DRAWINGS

FIG. 4 is the partial enlargement of the above mentioned first photoelectrical transducer 1, whereby FIG. 4a shows a plane view while

FIG. 5 shows the partial enlargement of the above mentioned second photoelectrical transducer 3, whereby FIG. 5b shows the sectional view while

FIG. 6 shows the partial section of the joined state of the photoelectrical transducing unit shown in FIG. 1, in enlargement whereby FIG. 6a shows the first embodiment shown in FIG. 2a and FIG. 2b while

FIG. 9 shows the disposition of the important part of an embodiment of the photographic camera capable of automatic focussing in which the fundamental disposition of the optical instrument shown in FIG. 7 is made use of.

FIG. 14 shows the important disposition of an embodiment of the photographic camera capable of the automatic focussing in which the fundamental disposition of the optical instrument shown in FIG. 12 is made use of.

FIG. 19 shows in sketch an improvement of the optical instrument shown in FIG. 17, in which a liquid crystal cell 65 is applied in place of the diffusion plate 59 in the optical instrument shown in FIG. 17, whereby FIG. 19a shows an embodiment in which the liquid crystal cell 65 is provided in the optical path between the objective lens 23 and the photoelectric transducing unit 20 while FIG. 19b shows an embodiment in which the liquid crystal cell 65 is provided in the optical path before the objective lens 23.

FIG. 20 shows in sketch the fundamental disposition of the equipment capable of automatically adjusting the initial value of the intensity to be measured basing upon the principle of the equipment shown in FIG. 17, in the optical instrument shown in FIG. 12.

DESCRIPTION OF THE PREFERRED EMBODIMENTS

Below several embodiments of the photoelectrical transducing unit according to the present invention and of the system for detecting the sharpness of the image of object by means of the photoelectrical transducing unit will be explained according to the accompanying drawings.

Figure 1:
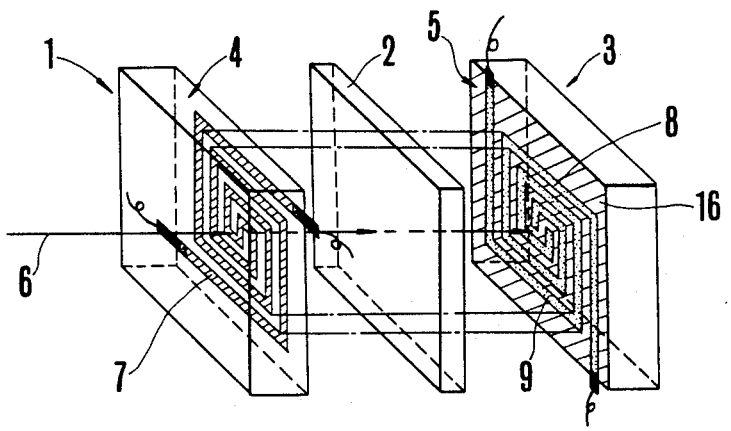
FIG. 1 shows a spatial disposition of the photoelectrical transducing unit according to the present invention in perspective view.

FIG. 1 shows a fundamental spatial disposition of the photoelectrical transducing unit according to the present invention.

For easy understanding the first photoelectric transducer 1, a permeable thin insulation layer 2 and the second photoelectric transducer 3 are shown, being separated from each other, namely in the state before the above mentioned three elements (1, 2, 3) are joined with each other. These three elements (1, 2, 3) are joined with each other to form the photoelectric transducing units as shown in FIG. 5, FIG. 6a and FIG. 6b. In this case, the photosensitive layer 7, 8 (consisting of for example CdS or CdSe) of the first and the second photoelectric transducer 1, 3 lies on the back surface 4 of the first photoelectric transducer 1 or on the front surface 5 of the second photoelectric transducer 3. The permeable insulation layer 2 should be as thin as possible and could be replaced for example, with a permeable thin vaporized foil or resin layer. The light beam passes through each layer of the above mentioned disposition according to the permeability and controls the electrical value of both of the photoelectric transducers 1 and 3.

Figure 2B:
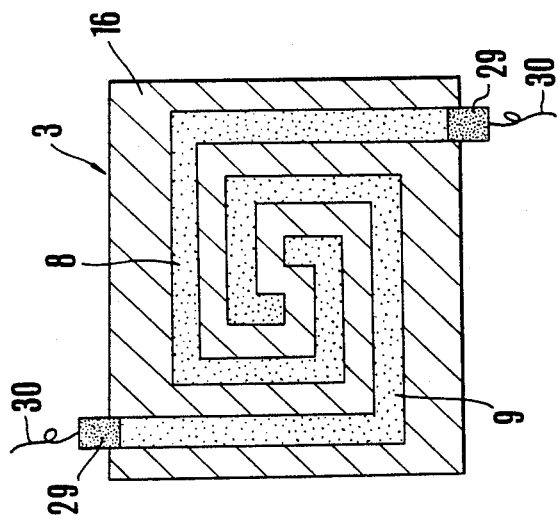
FIG. 2 shows the first and the second embodiment of the correlative disposition of the photosensitive layers (photoelectric semiconductor) as well as of the electrodes, whereby FIG. 2a and FIG. 2b respectively show the form of the photosensitive layer 7 of the first photoelectric transducer 1 and that of the counter electrodes 8, 9 of the second photoelectric transducer 3 of the first embodiment while FIG. 2c and FIG. 2d respectively show the form of the photosensitive layer 7 of the first photoelectrical transducer 1 and that of the counter electrodes 8, 9 of the second photoelectrical transducer 3 of the second embodiment.
Figure 2A:
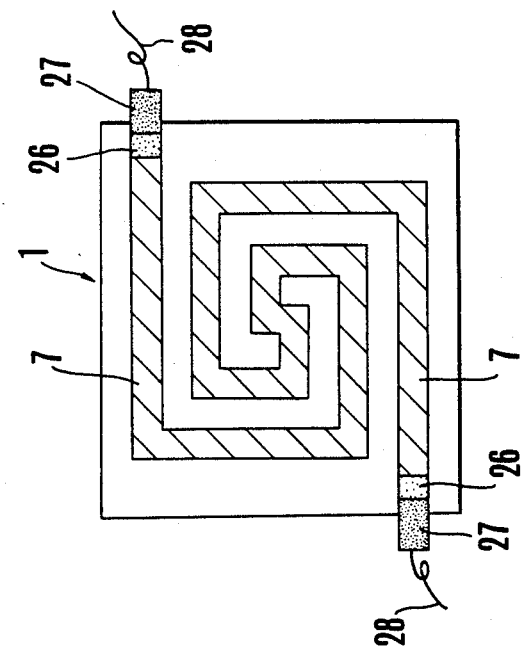
Figure 2D:
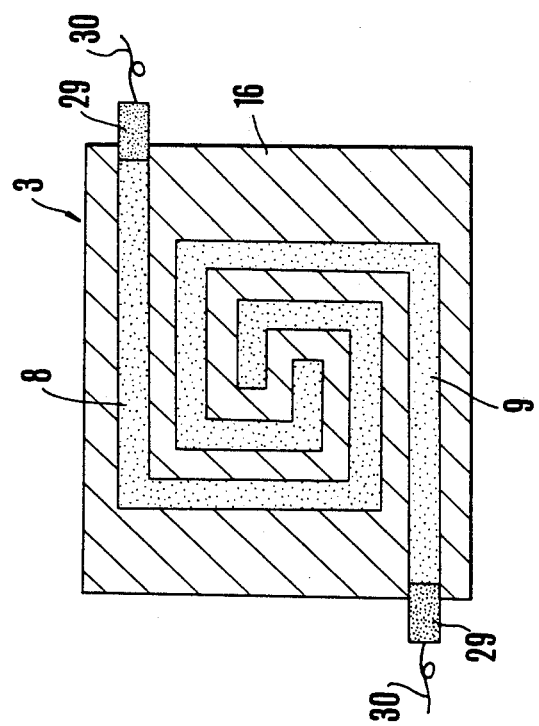
Figure 2C:
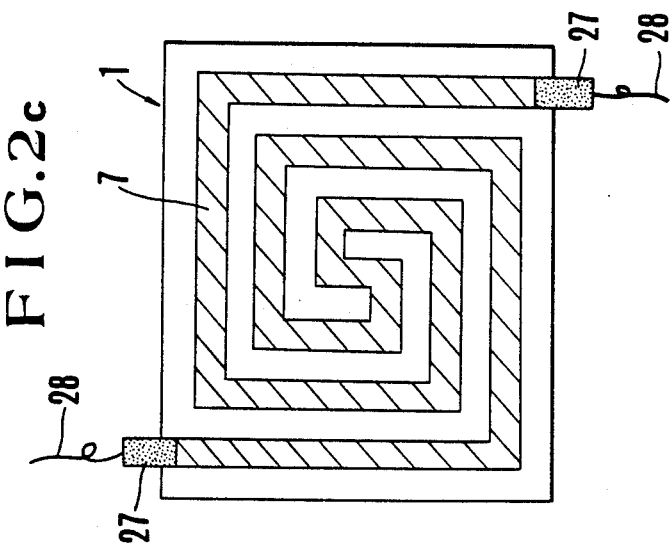

FIG. 2a and FIG. 2b as well as FIG. 2c and FIG. 2d show the relative disposition of the photosensitive layer (semipermeable body) and the electrodes, whereby FIG. 2a and FIG. 2b shows the first embodiment while FIG. 2c and FIG. 2d show the second embodiment. FIG. 2a and FIG. 2c show the form of the photosensitive layer 7 of the first photoelectrical transducer 1, constructed in such a manner that, as is shown in the drawings, a thin belt-shaped photoelectric semiconductor is wound up bifilar-spirally with the center at the middle of the above mentioned surface 4, whereby at both ends of the photoelectric semiconductor the electrode pieces 26 are provided. The above mentioned first photoelectric transducer 1 presenting the disposition as mentioned above, of the photosensitive layer as well as the electrodes has the efficiency as "series type photoelectric transducer". 27 are the terminals connected to the above mentioned electrode pieces, 28 the lead wires connected to the terminals.

FIG. 2b and FIG. 2d show the form of a pair of the electrode pieces 8, 9 of the second photoelectric transducer 3, whereby the pair of the electrode pieces 3 are formed in such a manner that two long, thin, belt-shaped conductors are wound up on the photosensitive layer 16 formed all over the above mentioned surface 5, with the center at the middle of the surface 5. The above mentioned second photoelectric transducer 3 presenting such disposition as mentioned above, of the electrodes as well as the photosensitive layer has the efficiency as "parallel type photoelectrical transducer". 29 is the one terminal of the above mentioned electrode pieces 8, 9, namely the terminal connected to the end close to the circumference of the surface 5, 30 the lead wire connected to the terminal 29.

Hereby the difference between the first embodiment shown in FIG. 2a and FIG. 2b and the second embodiment shown in FIG. 2c and FIG. 2d lies in the fact that in case of the above mentioned first embodiment the photosensitive layer 7 of the first photoelectric transducer 1 does not overlap the electrode pieces 8, 9 of the second photoelectric transducer 3, namely the electrodes pieces 8, 9 are situated in the space formed by the photosensitive layer 7 when the first photoelectric transducer 1 and the second photoelectric transducer 3 are joined over each other by means of the insulation layer 2 (The then disposition is shown in FIG. 6a in detail) while in case of the second embodiment the electrode pieces 8, 9 of the second photoelectric transducer 3 overlap the photosensitive layer 7 of the first photoelectric transducer 1, namely the light beam receiving zone of the photosensitive layer 16 of the second photoelectric transducer 3 is situated in the space formed by the photosensitive layer 7 of the first photoelectric transducer 1 (The then disposition is shown in FIG. 6a in detail).

In consequence in case of the above mentioned first embodiment as will be explained later in detail it is necessary that not only the photosensitive layer 7, 16 should be permeable whereby the total surface 5 should be filled with the photosensitive layer 16 but also the electrode pieces 8, 9 should be processed by metalization so as to be also permeable while in case of the second embodiment it is not always necessary that the photosensitive layers 7, 16 as well as the electrode pieces 8, 9 should be permeable whereby it is sufficient that the photosensitive layer 16 should fill only the space formed by the electrode pieces 8, 9.

Figure 3A:
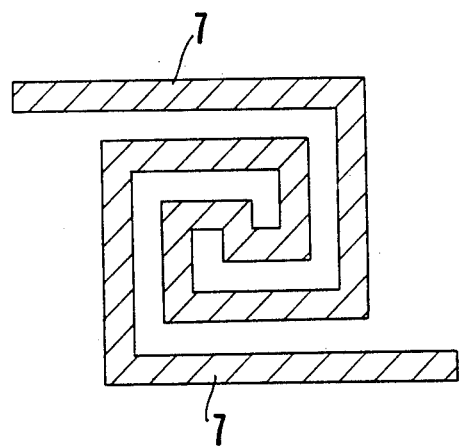
FIG. 3 shows in sketch the mutual relation of the correlative disposition of the photosensitive layer 7 and the counter electrodes 8, 9 of the first and the second embodiment, whereby the mutual relation of the correlative disposition of the photosensitive layer 7 and the counter electrodes 8, 9 are shown in FIG. 2 can be understood easily when the drawing is folded along the line 10, namely FIG. 3a and FIG. 3c respectively show the form of the photosensitive layer 7 whoes spiral direction is reversed to that of the photosensitive layer 7 shown in FIG. 2a and FIG. 2c (corresponding to the case when FIG. 2a and FIG. 2c are seen from the back side of the drawing) while FIG. 3b and FIG. 3d respectively show the form of the counter electrodes 8, 9 shown in FIG. 2b and FIG. 2d.
Figure 3A:
Figure 3B:
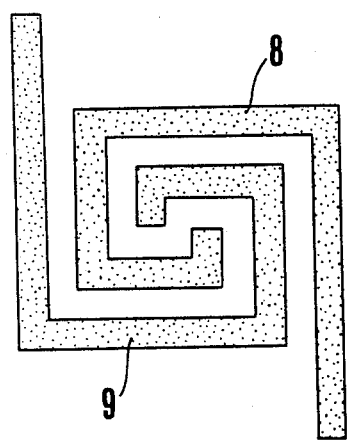
Figure 3C:
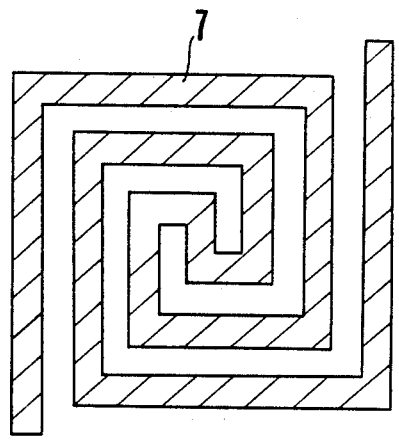
Figure 3C:
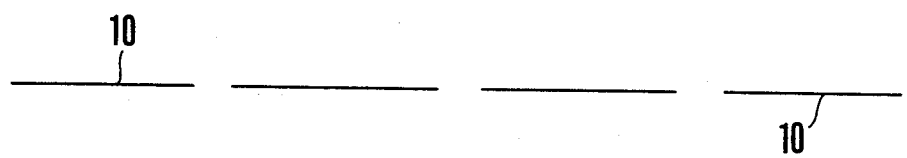
Figure 3D:
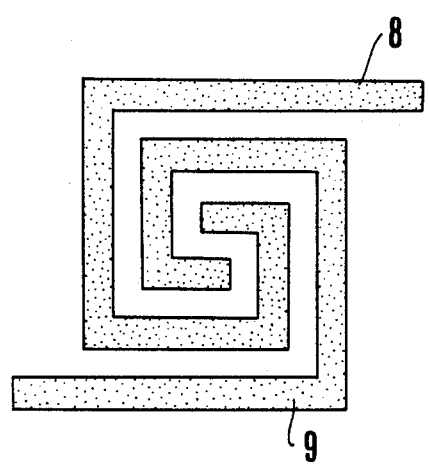

FIG. 3a, FIG. 3b, as well as FIG. 3c, FIG. 3d show the bifilar-spirally wound photosensitive layer 7 as well as the electrode pieces 8, 9 in principle similar to those shown in FIG. 2a, FIG. 2c as well as FIG. 2b, FIG. 2d, whereby however, the correlative direction of the rotation of the spiral of each element differs. Namely, the direction of the spiral of the photosensitive layer 7 in FIG. 3a, FIG. 3c is reversed to that of the photosensitive layer 7 shown in FIG. 2a, FIG. 2c, namely clockwise from outside to inside. (Anticlockwise from outside to inside in FIG. 2a, FIG. 2c). This corresponds to the mirror image of FIG. 2a, FIG. 2c respectively. The reason why this disposition corresponding to the mirror image is that the back side 4 of the first photoelectric transducer 1 is illuminated from inside.

The spiral of both of the electrode pieces 8 and 9 in FIG. 3b, FIG. 3d presents the same direction as that shown in FIG. 2b, FIG. 2d respectively, whereby the light beam reaches the front surface 5 of the second photoelectric transducer 3 from outside.

By folding FIG. 3a, FIG. 3b as well as FIG. 3c, FIG. 3d along the line 10 and putting the upper half over the lower half, the correlative relation corresponding to the above mentioned first and the above mentioned second embodiment of the conjugate bifilar spiral disposition is obtained in the joined state, more particularly, in case of FIG. 3a, FIG. 3b the relation that the photosensitive layer 7 does not overlap the electrode pieces 8, 9 while in case of FIG. 3c, FIG. 3d the relation that the photosensitive layer 7 overlaps the electrode pieces 8, 9 can be obtained. What is to be noticed here is the fact that the photosensitive layer 7, 16 of the photoelectric transducers 1, 3 are remarkably thin and directly opposed to each other, only been separated by means of a thin insulation foil 2 so that both of the photosensitive layers 7, 16 lie substantially in the same image plane from the photosensitive layer 7 to the photosensitive layer 16.

Figure 4A:
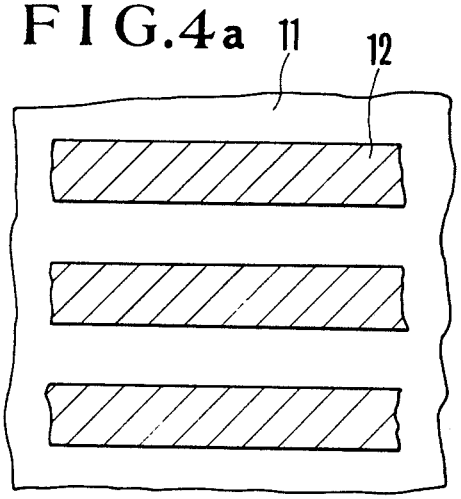
Figure 4B:
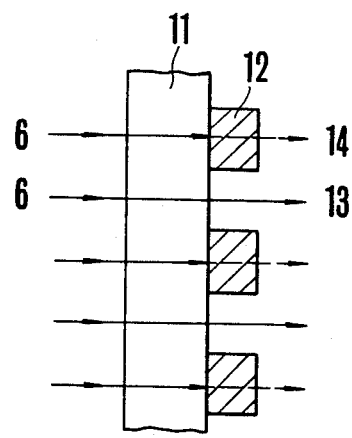
FIG. 4b shows a sectional view.

FIGS. 4a, 4b, 5a, 5b, 5c, 6a and 6b respectively show the detail of the disposition of the photoelectric transducing unit according to the enlarged section. FIG. 4a shows the front view of the first photoelectric transducer 1, while FIG. 4b shows the side view thereof. On the permeable support plate 11, for example, a bifilar-spiral photosensitive layer zone 12 is brought. This photosensitive layer zone 12 presents a photosensitive layer 7 for example, spiral as a whole. After having passed through the permeable support plate 11 the light beam 6 reaches the photosensitive layer zone 12 from the inside of the support plate 11. The light beam coming out of the back side of this first photoelectric transducer is differently attenuated according to whether the light beam has passed only through the permeable support plate 11 (light beam 13) or further passed through the photosensitive layer zone 12 consisting of permeable, (for example light yellow) CdS (light beam 14). (Hereby in case of the above mentioned second embodiment it is not always necessary that the above mentioned photosensitive layer zone 12 should be permeable).

Figure 5A:
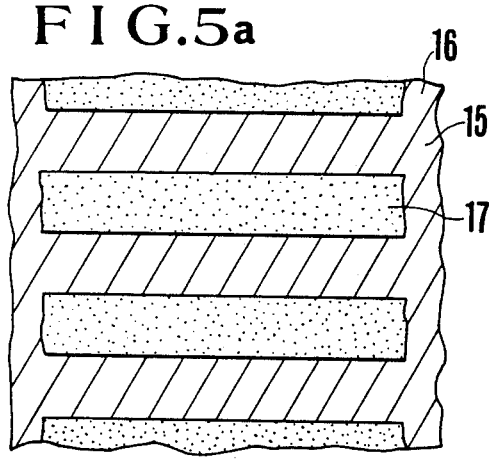
FIG. 5a shows the plane view of the second photoelectrical transducer 3 shown in FIG. 2b
Figure 5B:
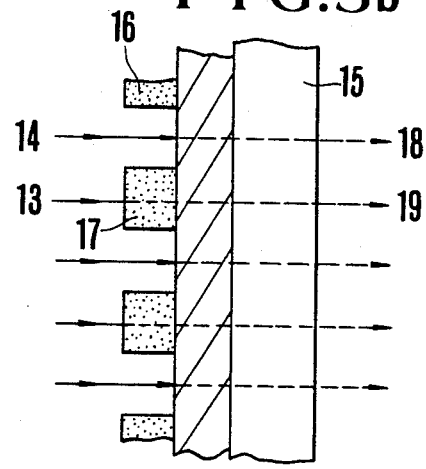
Figure 6A:
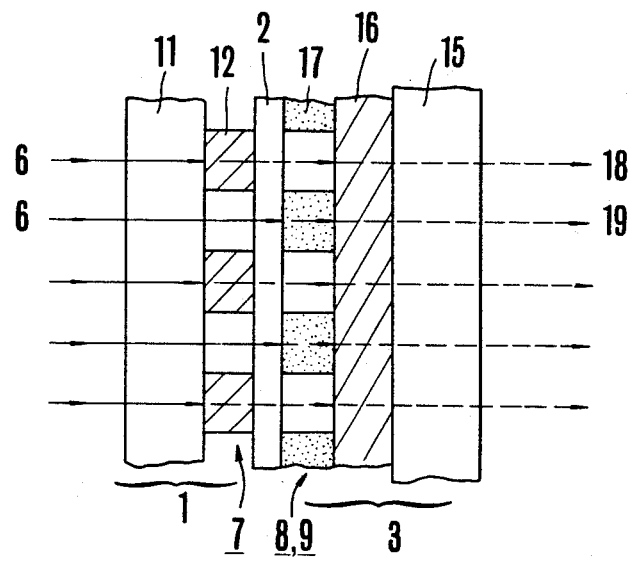
Figure 6B:
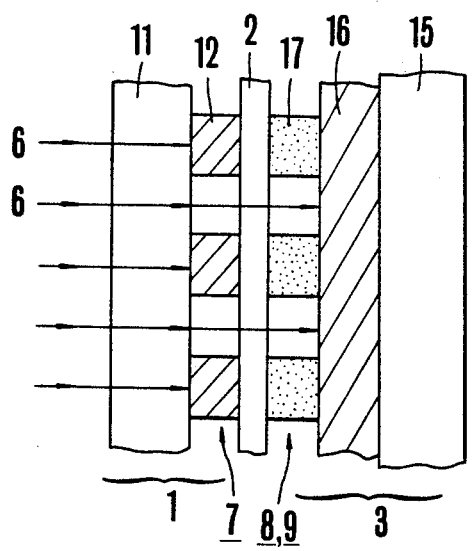
FIG. 6b shows the second embodiment shown in FIG. 2c and FIG. 2d.

FIG. 5a shows the front view of the second photoelectric transducer 3 (shown in FIG. 2b) of the above mentioned first embodiment while FIG. 5b shows the side section thereof. On the permeable support plate 15 hereby for example at first the photosensitive layer 16 is formed for example all over the surface. On this layer 16 a parallel type conductor 17 presenting a permeability by means of for example, metalization process is immediately formed. This conductor 17 as a whole forms a pair of bifilar-spiral electrode pieces 8 and 9 in FIGS. 2b and 3b.

The sequence of the disposition of the photosensitive layer 16 and the conductor as well as the first and the second photoelectric transducer can be changed.

The intensity of the light beam coming out of the back side of the plate 15 after having passed through the photosensitive layer 16 is weak as compared with that of the light beam 14 due to the permeability of the light beam of the photosensitive layer 16 and the plate 15.

Likely the intensity of the light beam 19 coming out of the back side of the plate after having passed through the conductor 17 and the photosensitive layer 16 is weak as compared with that of the light beam 13 due to the permeability of the light beam of the conductor 17 and the photosensitive layer 16.

FIG. 6 shows in section the combination of FIGS. 4b and 5b presenting a thin insulation layer 2 serving as between-layer, namely the first embodiment of the photoelectric transducing unit according to the present invention as a whole. In order that hereby no undesirable influence could not be given to the photoelectric transducing unit (21) located optically backwards in case of the combination according to the present invention in which for example, as is particularly shown in FIG. 13 two photoelectric transducing units (20, 21) are utilized in series, it is necessary that the light beams 18 and 19 coming out of the photoelectric transducing unit 20 located optically at least forwards are always equal to each other in their intensity when a light beam 6 even in the intensity reaches the front surface of the unit 20.

Hereby let the permeability of the light beam of each element composing the above mentioned unit be "$q$" (The index of "$q$" indicates the number of the element of the above mentioned unit), so the intensities $I_{18}$ and $I_{19}$ of the above mentioned light beams 18 and 19 are as follows:

$I_{18} = I_6 \cdot q_{11} \cdot q_{12} \cdot q_2 \cdot q_{16} \cdot q_{15}$ $I_{19} = I_6 \cdot q_{11} \cdot q_2 \cdot q_{17} \cdot q_{16} \cdot q_{15}$ whereby $I_6$ is the intensity of the light beam 6.

Hereby in order that $I_{18}$ is equal to $I_{19}$, $q_{17}$ should be equal to $q_{12}$.

In consequence in case of the unit located optically forwards it is necessary to select the permeability of the light beam of the conductor 17 so as to correspond with that of the insulation layer 2 so that the light beams 18 and 19 are finally equal to each other.

Figure 5C:
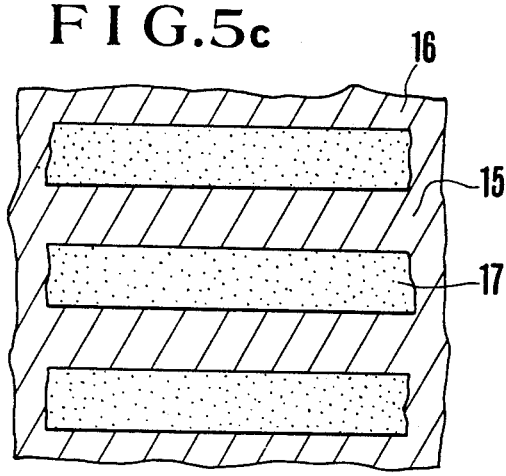
FIG. 5c shows the plane view of the second photoelectrical transducer 3 shown in FIG. 2d
Figure 5D:
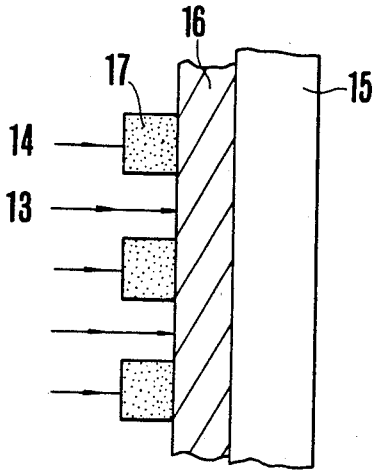
FIG. 5d shows the sectional view.

FIG. 5c shows the front view of the second photoelectric transducer (shown in FIG. 2d) of the above mentioned second embodiment while FIG. 5d shows the side view thereof. The second photoelectric transducer 3 of the present embodiment is composed similarly to that of the above mentioned first embodiment, so that the explanation is omitted.

FIG. 6b shows in section, similarly to the case of FIG. 6a, the combination of FIG. 4b and FIG. 5d presenting the insulation layer 2 serving as between-layer, namely the second embodiment of the photoelectric transducing unit according to the present form as a whole. As is clear from FIG. 6b in case of the unit of the present embodiment the photosensitive layer zone 12 of the first photoelectric transducer 1 never overlaps the effective photosensitive zone of the photosensitive layer 16 of the second photoelectric transducing unit 3, namely the spatial zone formed by the conductor 17 (namely the electrode pieces 8 and 9) so that it is not alway necessary that the photosensitive layers 7, 16 as well as the electrode pieces 8, 9 should be permeable.

Several embodiments of the optical instruments according to the present invention in which such photoelectric transducing units as composed above will be explained below.

Figure 7:
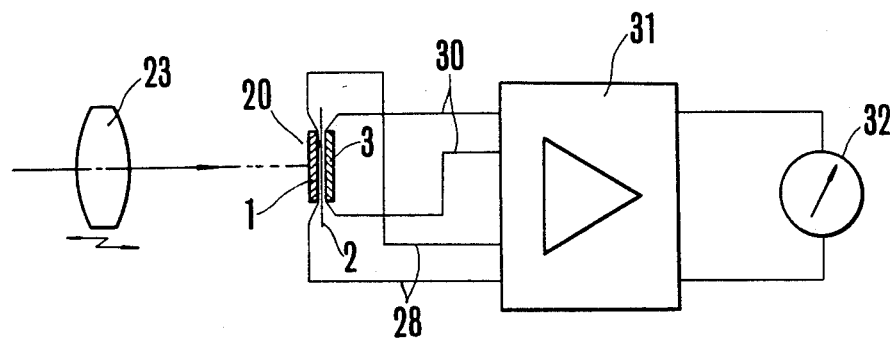
FIG. 7 shows in sketch the fundamental disposition of the important part of the optical instrument according to the present invention so constructed as to be able to detect the focussing of the optical instrument by detecting the sharpness of the image formed by the optics by means of one of the above mentioned photoelectrical transducing unit.
Figure 8:
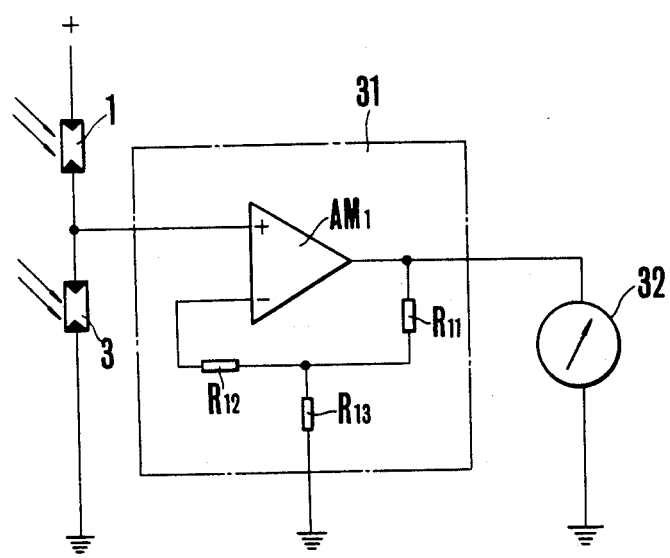
FIG. 8 shows an electrical circuit of the fundamental disposition of the signal processing circuit 31 in the optical instrument shown in FIG. 7.

FIGS. 7 and 8 show the fundamental disposition of the important part of the optical instrument for detecting the focussing by detecting the clearness of the image formed by the optical instrument by means of one of the above mentioned photoelectric transducing unit and an embodiment of the electric circuit thereof. In FIG. 7, 23 is the image forming optics for forming the image of an object not shown in the drawing. The photoelectric transducing unit 20 as a whole is disposed on the optical path of the optics 23 and in its focus plane so as to serve to detect the sharpness of the image formed by means of the optics 23. 31 is the electrical circuit for processing the electrical signals coming from the first and the second photoelectric transducers 1, 3 in the unit 20 while 32 is an indicator such as meter for indicating the state of focussing of the optics 23 by means of the output of the above mentioned electrical circuit 31.

As is shown in FIG. 8, the first and the second photoelectric transducer 1, 3 in the unit 20 are connected in parallel with each other whereby to their connecting point (voltage deviding point) the above mentioned signal processing circuit 31 is connected. The present circuit 31 fundamentally consists of the processing amplifier $AM_1$ receiving the output signals from the above mentioned photoelectric transducers 1, 3 at its non inversion input side and resistances $R_{11}$, $R_{12}$ and $R_{13}$ connected in the negative feed back circuit from the output side to the inversion input side of the above mentioned processing amplifier $AM_1$ for setting a desirable amplification factor of the processing amplifier $AM_1$, whereby the above mentioned indicator 32 is connected to the ouput terminal of the circuit 31.

The first and the second photoelectric transducer 1, 3 of the unit 20 disposed so as to correspond with the focus plane of the above mentioned optics 23 react to the sharpness, in other words the degree of the contrast of the image formed by the above mentioned optics 23 and search the limit value of the resistance value in accordance with the maximum contrast of the then image when the optics 23 is in the optimal state of the focus adjustment. Namely, the first photoelectric transducer (series type photoelectric transducer) 1 presenting a photosensitive layer 7 disposed electrically in series searches the maximum value of its resistance value for the maximum contrast of the image. On the other hand, the second photoelectric transducer (parallel type photoelectric transducer) 3 presenting the photosensitive layer 16 disposed electrically in parallel searches the minimum value of its resistance value for the maximum contrast of the image when $\gamma$ is larger than 1 ($\gamma > 1$) in the following relation of the resistance value R and the luminance B $$R = \frac{A}{B^\gamma} \ (\Omega)$$

A: an optional constant

γ: a constant proper to the photoelectric semiconductive material forming the photosensitive layer In consequence the voltage devided by the voltage devider consisting of the series type photoelectric transducer 1 and of the parallel type photoelectric transducer 3 with γ larger than 1, connected in series with the series type photoelectric transducer 1 as is shown in FIG. 8 assumes the minimum value.

In order that hereby the voltage deviding ratio $U_3/U_{(1+3)}$ of the voltage dividers (1, 3) could not be influenced by the mean luminance B for a wide range, it is necessary that the indices $\gamma_1$ and $\gamma_3$ are equal to each other and preferably larger than 1 in the relation of the resistance value and the luminance $$R_1 = \frac{A_1}{B^{\gamma_1}} \ (\Omega), \quad R_3 = \frac{A_3}{B^{\gamma_3}} \ (\Omega)$$

whereby $A_1$ and $A_3$ are optional constants. Namely, $$\gamma_1 = \gamma_3 > 1$$

Hereby it is possible to realize $\gamma_1 = \gamma_3$ by forming both of the photosensitive layers 7 and 16 at the same time by means of for example vaporization process. Thus $$\frac{U_3}{U_{(1+3)}} = \frac{R_3}{R_1+R_3} = \frac{A_3}{A_1 \cdot B^{(\gamma_3-\gamma_1)} + A_3} = \frac{A_3}{A_1+A_3} \quad F(B)$$

$$(\gamma_1 = \gamma_3)$$

In short, the voltage deviding ratio of the voltage devider (1, 3) is not influenced by the mean luminance B in case $\gamma_1 = \gamma_3$ in the photoelectric transducer 1, 3. In consequence even if the sharpness, namely the contrast of the image is in a low state the voltage variation taking place at the voltage deviding point, namely the connecting point of the photoelectric transducer 1, 3 forms a signal voltage at the input side of the signal processing circuit 31 whose output voltage is led to the indicator 32.

In this way by means of the optical instrument shown in FIGS. 7 and 8, it is possible to detect the sharpness of the image formed by the optics 23 with high accuracy as well as to detect the focussing of the optics 23 with exactness.

Hereby it is easily possible to replace the above mentioned indicator 32 with an electrical driving means such as motor which receives the output of the above mentioned processing circuit 31 so as to drive the above mentioned optics 23 along its optical axis in such a manner that an automatic focus adjusting equipment can easily been realized according to the present invention.

Below an embodiment of the photographic camera capable of automatic focus adjustment of the photographing optics in which camera the automatic focus adjustment equipment according to the present information, adopting the fundamental disposition of the optical instrument shown in FIG. 7 is provided will be explained.

Figure 9:
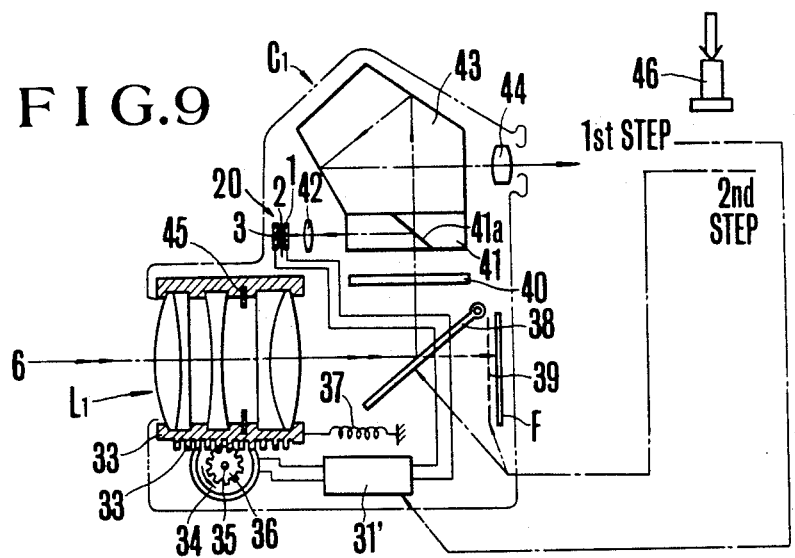
Figure 11:
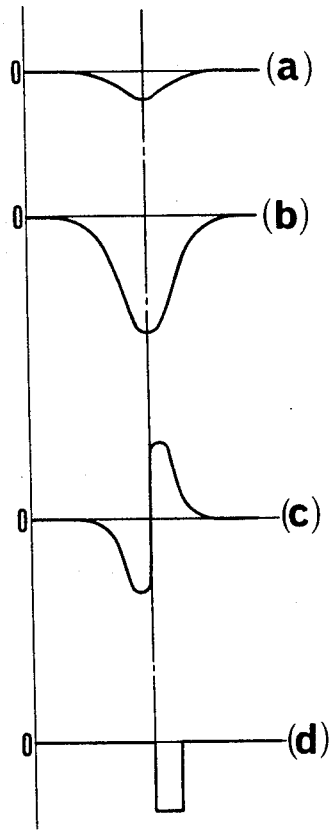
FIG. 11 shows the output wave forms for showing the variation of the output signals according to the elapse of the time, out of the wirings 47, 48, 49 and 50 of the electrical circuit shown in FIG. 10.
Figure 10:
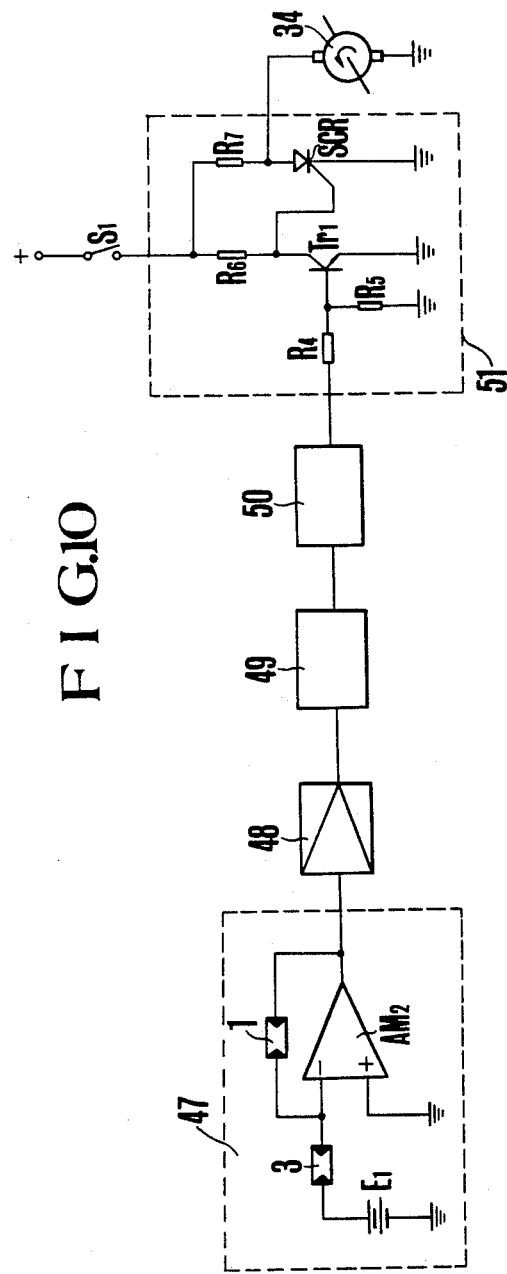
FIG. 10 shows an electrical circuit of the fundamental disposition of the control circuit 31' in the camera $C_1$ shown in FIG. 9.

FIG. 9 shows the disposition of the important part of the camera designed so as to be capable of automatic focus adjustment of the photographing optics according to the present invention, while FIG. 10 shows the electrical circuit and FIG. 11 shows the wave forms of signals at the important positions of the signal processing circuit.

In FIG. 9, the camera capable of automatic focus adjustment in indicated with $C_1$ as a whole. $L_1$ is a photographing lens system, which is held so as to be moved along its optical axis by means of a lens barrel 33 presenting a rack 33a on a part. In the rack 33a, a pinion gear 36 secured on the rotary shaft 35 of the motor 34 is engaged. In consequence the lens barrel 33 is advanced forwards in the camera (to the left in the drawing) while holding the lens system $L_1$ in accordance with the rotation of the motor 34 along the direction of the arrow in FIG. 9. 37 is a spring provided between the camera body and the lens barrel 33, by means of which spring the lens system $L_1$ is normally set at the most withdrawn position (a certain determined stopping position to the right in the drawing) when the motor 34 is out of operation. 38 is a conventional reflecting mirror, 39 the opening and closing member of the shutter, F the film, 40 the focus plate, 41 the light beam splitter. The light beam 6 coming from an object not shown in the drawing passes through the lens system $L_1$, is reflected by the movable reflecting mirror 38, further passes through the focus plate 40 and then is devided into the reflected light beam and the passed light beam by means of a semireflecting plane 41a of the light beam splitter 41. The then passed light beam is reflected by the pentagonal prism 43 and reaches the eye piece 44. On the other hand, the light beam reflected by the semireflecting plane 41a of the light beam splitter 41 passes through the lens 42 and enters into the photoelectric unit 20.

Hereby 42 is the image reforming lens for forming again the image of the image formed on the focus plane 40, of an object by means of the photographing lens system $L_1$, whereby the photoelectric transducing unit 20 is provided on the focus position of the above mentioned lens 42. 31' is the control circuit which processes the output of the above mentioned unit so as to control the motor 34, whereby its details are shown in FIG. 10.

45 shows the photographing diaphragm, 46 the shutter release button of the camera symbolically according to the efficiency.

In the electrical circuit shown in FIG. 10, 47 is the detecting circuit for detecting the sharpness of the image formed by the above mentioned lens system $L_1$, of an object, fundamentally consisting of the current source $E_1$, the processing amplifier $AM_2$, the series type photoelectric transducer 1 and the series type photoelectric transducer 3. The disposition of the above mentioned circuit 47 is characterized in that the series type photoelectric transducer 1 is connected to the feed back circuit of the processing amplifier $AM_2$ while the parallel type photoelectric transducer 3 is connected to the inversion input circuit of the processing amplifier $AM_2$. In consequence, the amplification factor of the above mentioned detecting circuit 47 is proportional to $R_1/R_3$ ($R_1$ and $R_3$ being the resistance values of the transducers 1 and 3 respectively) as is usually known, so that the output of the above mentioned detecting circuit 47 assumes the minimum value when the sharpness of the image is maximum as is already explained. FIG. 11, (a) shows the then situation. 48 is a conventional amplifying circuit for amplifying the output of the detecting circuit 47, and amplifies the output of the above mentioned detecting circuit 47 sufficiently as is shown in (b) in FIG. 11 in such a manner that the output could by easily processed later. 49 is a conventional differentiating circuit for differentiating the output of the amplifying circuit 48, whereby the polarity of the output of said differentiating circuit 49 is inversed instantly as is shown in (c) in FIG. 11, when the output of the circuit 47, namely the sharpness of the image is maximum.

50 is a conventional comparing circuit for comparing the output of the differentiating circuit 49 with a certain predetermined standard voltage, giving out a certain predetermined level of output when the output of the circuit 49 transpasses the standard voltage. In consequence, it can easily be understood that at the time point at which the sharpness of the image is maximum the above mentioned predetermined level of output is given out as is shown in (d) in FIG. 11 in case the standard voltage is set at the 0 level.

51 is the braking circuit for quickly braking the motor 34 by means of the output of the comparing circuit 50, presenting the transistor $Tr_1$, the thyrister SCR and the resistances $R_4$, $R_5$, $R_6$ and $R_7$. $S_1$ is the starting switch for starting the motor, being in functional engagement of the above mentioned release button 46.

Below the operation of the present camera will be explained. When at first the two step release button 46 is pushed down to the first step the switch $S_1$ is closed in such a manner that the motor 34 is started. When the motor 34 is started, the photographing lens system $L_1$ set to the most withdrawn position by means of the operation of the spring 37 is advanced forward against the force of the spring 37. According as the lens system $L_1$ is advanced, the sharpness of the image formed on the photoelectric transducing unit 20 is gradually changed. When then the sharpness of the image on the above mentioned unit 20 is maximum, as mentioned above the comparing circuit 50 gives out an output as shown in (d) in FIG. 11, which output is led into the base of the transistor $Tr_1$ through the resistances $R_4$ and $R_5$ in the braking circuit 51. In this way, in the braking circuit 51 the transistor $Tr_1$ so far in the conductive state is brought into the cut-off state so that the thyristor SCR so far in the cut-off state is brought into the conductive state in such a manner that both terminals of the motor 34 are short-circuited and the motor 34 is braked quickly so as to keep the lens system $L_1$ at the stopping position. In this state, the image of an object to be photographed by means of the lens system $L_1$ becomes most clear on the film F. When the release button 46 is further pushed down to the second step in this state, the movable semireflecting mirror 38 springs up while the shutter operating member 39 operates so as to give exposure to the film F.

When the pushed down release button 46 is released after finishing the photographing, the switch $S_1$ is opened in such a manner that the motor 34 becomes free so that the lens system $L_1$ is returned to the predetermined withdrawn position due to the operation of the spring 37.

In this way, the focus adjustment of the photographing optics in the present embodiment of the photographic camera can be carried out completely automatically.

So far the embodiment of the optical instrument with only one photoelectric transducing unit 20 has been explained, while the optical instrument with two photoelectric transducing unit will be explained below.

Figure 12:
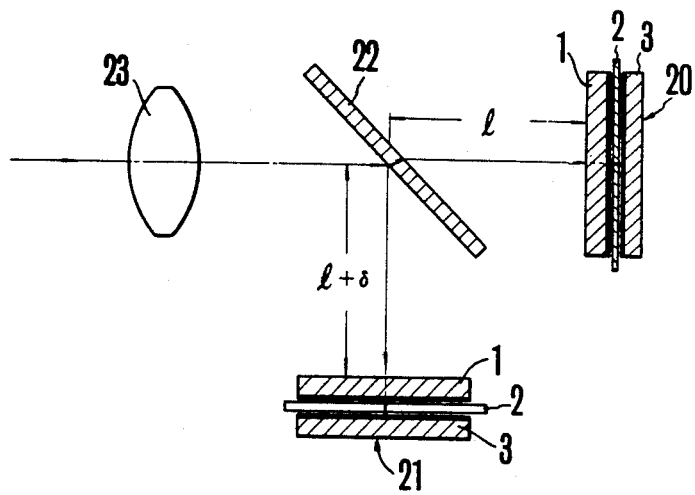
FIG. 12 shows in sketch the first embodiment of the disposition of especially two photoelectrical transducing units in an optical instrument so constructed as to be able to automatically adjust the focussing of the optics by detecting the sharpness of the image of the object formed by the optics by means of the above mentioned two photoelectrical transducing units.
Figure 13:
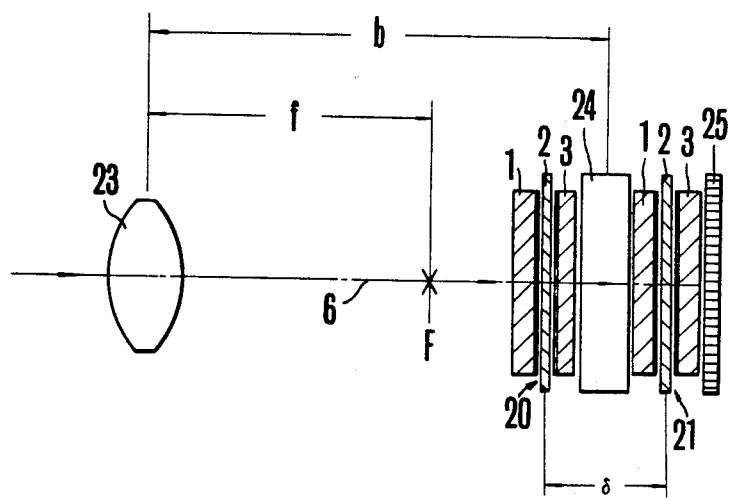
FIG. 13 shows in sketch the second embodiment of the disposition of especially two photoelectrical transducing units in an optical instrument so constructed as to be able to automaticlly adjust the focussing of the optics by detecting the sharpness of the image of the object formed by the optics by means of the above mentioned two photoelectrical transducing units.

FIGS. 12 and 13 show two embodiments of the disposition of especially photoelectric transducing unit in the optical instrument which is capable of detecting the focussing of the optics or automatical focus adjusting by means of two photoelectric transducing units.

FIG. 12 shows the disposition of the two photoelectric transducing units 20 and 21 combined with each other by means of the semipermeable mirror 22 and being suited for the automatic focus adjustment of the objective lens 23, whereby as is shown in the drawing the photoelectric transducing unit 20 is disposed by a distance $l$ apart from the semipermeable mirror 22 while the photoelectric transducing unit 21 is disposed by a distant $l + \delta$ apart from the semipermeable mirror 22. Hereby the objective lens 23 is disposed to the both units 20 and 21 in such a manner that the focus plane is set by a distance $l + \delta/2$ apart from the semipermeable mirror 23. In other words, the both units 20 and 21 are disposed by a distant $\delta/2$ before respectively behind the focus plane of the objective lens 23.

In consequence, in the state in which an object not shown in the drawing is focussed by the objective lens 23 the distance of the image of the object from the mirror 22 to the both units 20 and 21 is as follows:

$$b = l + \delta/2$$

Namely, the contrast of the details of the images on the units 20 and 21 is neither maximum nor minimum. The images on the units 20 and 21 are not sharp.

Figure 21:
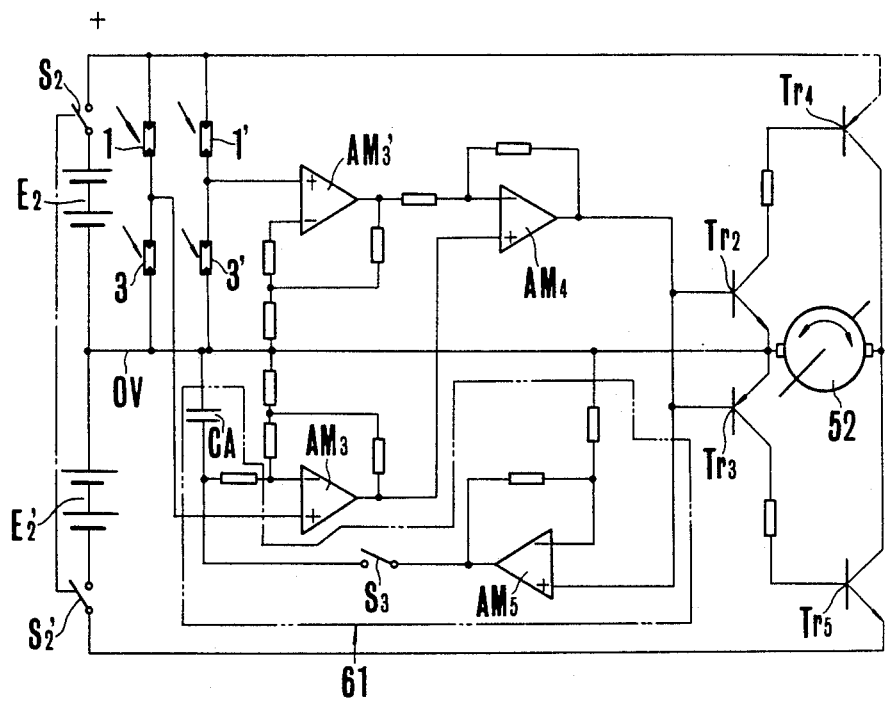
FIG. 21 shows the electrical circuit of the fundamental disposition of the signal processing circuit 60' in the optical instrument shown in FIG. 20.
Figure 16:
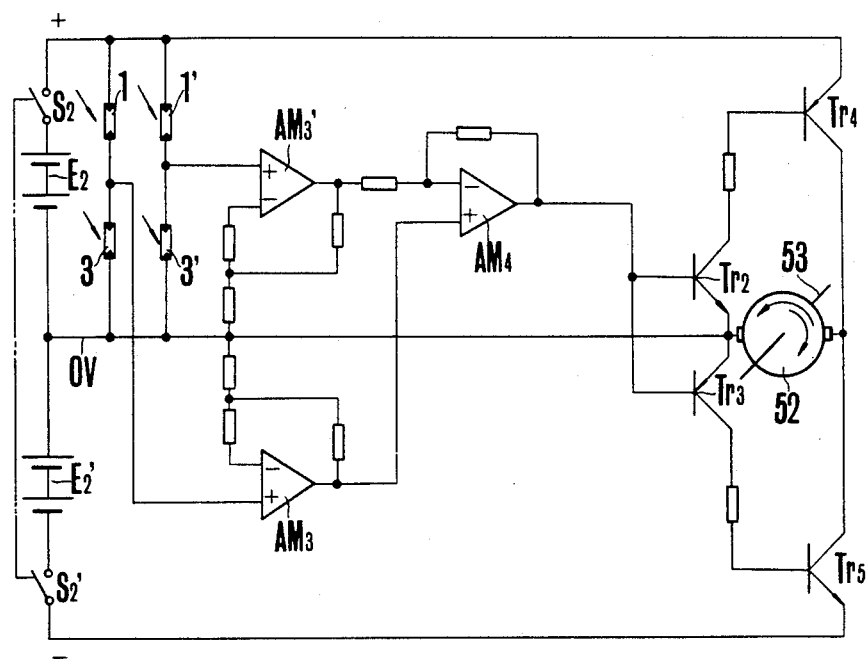
FIG. 16 shows the electrical circuit of the fundamental disposition of the control circuit 31″ of the photographic camera $C_2$ shown in FIG. 14 as well as of the motion picture camera shown in FIG. 15.

Hereby as electrical circuit for processing the output signals of the both units 20 and 21 in the fundamental equipment shown in FIG. 21 for example, such an electrical circuit as is shown in FIG. 16 is suited, whereby in the above mentioned state the above mentioned electrical circuit does not produce an amending signal because the output of the unit 20 is equal to that of the unit 21.

On the other hand, when the object approaches the objective lens 23 the then distance $b'$ of the image of the object, from the mirror is greater then $b$, namely $$b' > l + \delta/\!/2$$

so that a "sharp" image is formed on the comprising unit 21 while a "less sharp" image is formed on the unit 20.

Further, when to the contrary, the object leaves the objective lens 23 the then distance $b''$ of the image of the object, from the mirror is smaller then $b$, namely $$b'' > l + \delta/\!/2$$

so that a "less sharp" image is formed on the comparison unit 21 while a "sharp" image is formed on the unit 20. In such a case, the electrical cicuit as is shown in FIG. 16, for processing the output signals of the both units 20 and 21 produces an amending signal which is not 0 and serves to focus the objective lens 23 toward the above mentioned object. In this way, the motor 52 such as shown in FIG. 16 for adjusting the objective lens 23 is started.

The disposition shown in FIG. 12 already presents a substantially simplified arrangement as compared with the conventional one, by adopting two photoelectric transducing units according to the present invention, whereby a semipermeable mirror 22 serving as spectroscope is needed. However, in case as is shown in FIG. 13 by adopting the photoelectric transducing unit shown in FIG. 6a as the unit 20 located optically forward two photoelectric transducing units 20 and 21 are joined with each other by means of a permeable separating plate 24, it is possible to eliminate the mirror 22 also. In this case, the separating plate 24 substantially determinates the length $\delta$ of the optical path necessary for the comparison, between the both units 20 and 21.

The light beam absorbing layer 25 serves to shut the total light beam without reflection. Due to the total permeability $q20$ of the light beam of the first unit 20, the intensity of the light beam reaching the unit 21 is smaller, and therefore, the resistance values of both photoelectric transducers 1, 3 disposed in the unit 21 are higher than those in the unit 20, when their photosensitive layers present the same thickness so that the thickness $d_{21}$ of the photosensitive layer in the unit 21 is to be designed so as to fulfill the following relation relative to the thickness $d_{20}$ of the photosensitive layer in the unit 20

$$d_{21} \approx d_{20}/q_{20}$$

In consequence, when the image of the object is not formed in the both units 20 and 21 combined optically forwards respectively backwards, the mutually corresponding photoelectric transducers 1 and 3 in the above mentioned unit 20 and 21 always present almost same resistance value. By means of this method, the 0 point can be best stabilized in the comparing disposition over a wide range of luminance.

In case of the fundamental disposition of the equipments shown in FIGS. 12 and 13, different from the case shown in FIG. 7, it is possible to detect the direction of the focus of the objective lens 23, namely whether the focus is forwards or backwards can also be detected.

Below an embodiment of the photographic camera or the motion picture camera capable of automatic focus adjustment of the photographing optics in which camera the automatic focus adjusting equipment according to the present invention adopting the fundamental disposition of the optical instrument shown in FIG. 12 is provided will be explained.

Figure 14:
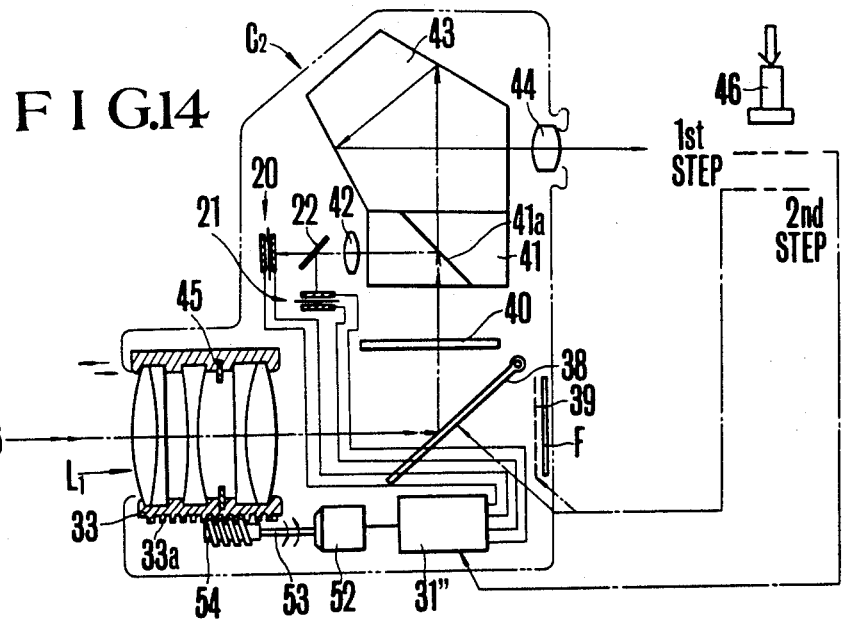
Figure 15:
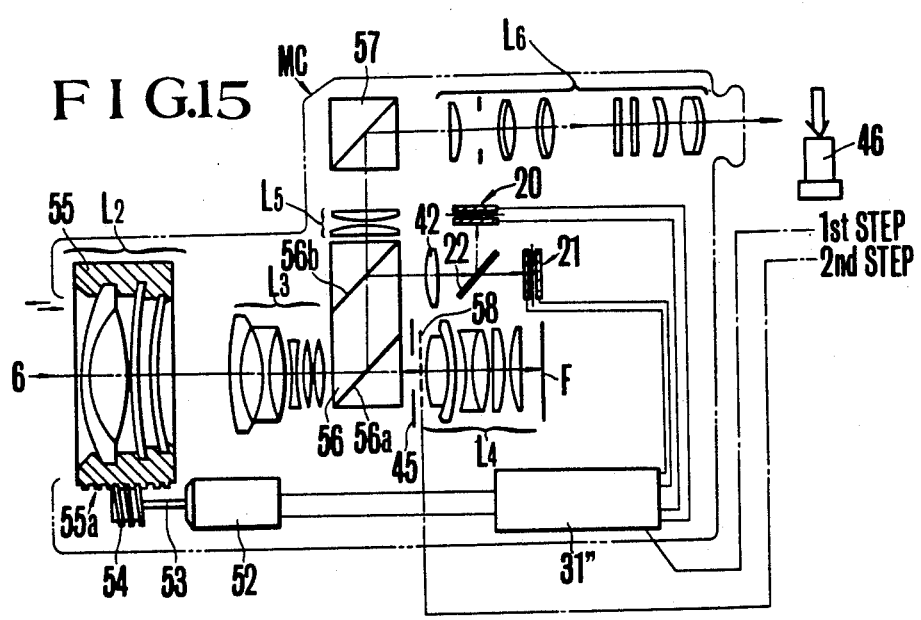
FIG. 15 shows the important disposition of an embodiment of the motion picture camera capable of the automatic foccusing in which the fundamental disposition of the optical instrument shown in FIG. 12.

FIG. 14 shows the disposition of the important elements of the photographic camera capable of automatic focus adjustment according to the present invention, of the photographing optics. FIG. 15 shows the disposition of the important element of the motion picture camera according to the present invention and FIG. 16 shows the fundamental disposition of the electrical circuit for the automatic focus adjusting equipment of the camera.

At first, the case with the photographic camera will be explained. The elements presenting the same figures as those of the elements in FIG. 9, in the photographic camera $C_2$ shown in FIG. 14 present the same disposition and the same functions as the embodiment of the camera shown in FIG. 9, so that the explanations for such elements will be omitted or simplified in the followings.

The two photoelectric transducing units 20 and 21 and the semipermeable mirror in FIG. 14 are disposed according to the same fundamental disposition as that shown in FIG. 12. Namely, the both units 20 and 21 is disposed at a position by a distance $l$ respectively $l + \delta$ apart from the mirror 22, while the image reforming lens 42 is, similarly to the case of the objective lens 22 shown in FIG. 12, is disposed in such a manner that its focus plane is situated at a position by a distance $l + \delta/2$ apart from the mirror 22.

31" is the control circuit for controlling the reversible motor 52, precessing the signals produced in the above mentioned two units 20 and 21, whereby its details are shown in FIG. 16. 53 is the rotary shaft of the motor 52, 54 the worm gear connected with the rotary shaft 53, which worm gear engages in the rack 33a of the lens barrel 33 for holding the photographing lens system $L_1$. In consequence, the lens barrel 33 advances respectively retires holding the lens system $L_1$ in accordance with the forward respectively the backward rotation of the motor 52.

The electrical circuit shown in FIG. 16 is substantially a combination of the two electrical circuits shown in FIG. 8, whereby each circuit presents the same function as that shown in FIG. 8. In the drawing, $E_2$ and $E'_2$ are the current sources while $S_2$ and $S'_2$ are the switches which are closed at the same time when the release button 46 is pushed down to the first step. 1, 1' and 3, 3' respectively show the series type photoelectric transducers respectively the parallel type photoelectric transducers in the two photoelectric transducing unit 20 and 21, whereby for the easy explanation the series type photoelectric transducer and the parallel type photoelectric transducer in the unit 21 present the figures 1' and 3'. The parallel type photoelectric transducers 1 and 3 are connected to the one input side of the processing amplifier $AM_3$ while the series type and the parallel type photoelectric transducer 1' and 3' are connected to the one input side of the processing amplifier $AM_{3'}$ as is shown in the drawing, whereby the output sides of the processing amplifiers $AM_3$ and $AM_{3'}$ are connected to the both input sides of the differential amplifier $AM_4$. $Tr_2$ and $Tr_3$ are the transistors whose bases receive the output of the above mentioned amplifier $AM_4$ whereby $Tr_2$ and $Tr_3$ are disposed, as is shown in the drawing, toward the motor 52 in such a manner that the transistor $Tr_2$ forms the first switching circuit for the motor 52 together with the transistor $Tr_4$ while the transistor $Tr_3$ forms the second switching circuit for the motor 52 together with the transistor $Tr_5$.

Below the operation of the present camera $C_2$ will be explained below. When the camera is directed toward a desired object to be photographed and the two step release button 46 is pushed down to the first step, the switches $S_2$ and $S_{2'}$ are closed in such a manner that the circuit shown in FIG. 16 starts the operation.

Hereby let the lens system $L_1$ be correctly focussed for an object to be photographed, not shown in the drawing, so the image of the object is formed at a position by about $\delta/2$ behind the unit 20 while the image of the object is formed at a position by about $\delta/2$ before the unit 21. In consequence, the images on the units 20 and 21 are not sharp to the same extent in such a manner that in the circuit shown in FIG. 16 almost the same devided voltage value appear at the both voltage devidens (1, 3; 1', 3'). The output voltage of the differential amplifier $AM_4$ in this case is almost 0 in such a manner that all the transistors $Tr_2-Tr_5$ are brought in the cut off state so that the motor 52 does not start.

In case the distance from the camera $C_2$ to the object to be photographed becomes smaller than that in the above mentioned case, the contrast of the image on the unit 20 lowers so that the input of the voltage devided in the voltage devider (1, 3) increases while the contrast of the image on the unit 21 increases so that the output of the voltage devided in the voltage devider (1', 3') lowers. As explained above, the outputs of the both units 20 and 21 are varied reversedly. Due to these different output of the devided voltage the amplifiers $AM_3$ and $AM_{3'}$ produce different voltages at their output terminals, in such a manner that the amplifier $AM_4$ produces a voltage substantially different from 0, for example, a positive voltage by means of which voltage the first switching circuit, namely the transistors $Tr_2$ and $Tr_4$ are brought in the switched on state so that the motor 52 starts to rotate according to such a direction in which the photographing lens system $L_1$ is best focussed for the object to be photographed, namely in such a direction in which the lens system $L_1$ is advanced forwards in this case. While, the lens system $L_1$ is advanced forwards according as the motor 52 rotates, the sharpness of the images on the unit 20 and 21 changes according to the elapse of time. When finally the lens system $L_1$ reaches the position at which the best focus adjustment is obtained for the object to be photographed, the transistors $Tr_2$ and $Tr_4$ are brought in the cut off state as explained so that the motor 52 stopps at the then position in such a manner that the lens system $L_1$ is held at the position at which the best focus adjustment is obtained for the object to be photographed. In this state, the image formed by the lens system $L_1$, of the object becomes most clear on the film F. When in this state, the release button 46 is further pushed down to the second step, the movable mirror 38 retires out of the optical path of the lens system $L_1$ while the shutter operating member 39 is operated so as to give an exposure to the film F.

When on the other hand, the distance from the camera $C_2$ to the object to be photographed becomes larger than that in the above mentioned case, contrary to the above mentioned case, the contrast of the image on the unit 20 increases so that the output of the voltage devided at the voltage devider (1, 3) decreases, while the contrast of the image on the unit 21 decreases so that the output of the voltage devided at the voltage devider (1', 3') increases. In consequence at the output terminals of the amplifier $AM_4$ a negative voltage appears quite contrary to the above mentioned case by means of which voltage the second switching circuit, namely, the transistors $Tr_3$ and $Tr_5$ are brought in the switched on state in such a manner that the motor 52 starts, in this case contrary to the above mentioned case, to rotate in such a direction in which the lens system $L_1$ is withdrawn backwards. When the lens system $L_1$ is retired until the best focus adjustment is obtained for the object to be photographed, the motor 52 stops similarly to the above mentioned case so as to keep the lens system at the then position.

In this way, the whole electrical circuit capable of automatic focus adjustment of the photographic lens system for an object with low contrast as is usual with the case of for example, the portrait photography can easily be replaced with an integral circuit according to the present technical standard of electronics.

Hereby the switches $S_1$ and $S_2$ are opened in functional engagement with the returning movement of the release button 46.

Below an embodiment of the motion picture camera will be explained.

FIG. 15 is a schematic diagram illustrating the automatic focussing device in accordance with the present invention incorporated in a motion picture camera. The elements presenting the same figures as those shown in FIGS. 9 and 14, of the motion picture camera MC shown in FIG. 15 present the same dispositions and the same functions as those in the embodiment of a photographic camera shown in FIG. 9 and FIG. 14, so that their explanations will be omitted or simplified. Among the photolens groups $L_2$, $L_3$ and $L_4$ the first and the second lens groups $L_2$ and $L_3$ are utilized in common as an objective lens for range detecting. Hereby the lens group $L_2$ is kept by the lens barrel 55 presenting a rack 55a and moved along its optical axis by means of the rotation of the motor 52. Between the lens group $L_3$ and the lens group $L_4$ a light beam splitter 56 presenting two permeable mirrors 56a and 56b is disposed. The lens group $L_5$, the reflecting prism 57 and the lens group $L_6$ compose a view finder optical system. The semipermeable mirror 56a is disposed stantly to the optical axis so that the light beam coming from the lens group $L_3$ to the film may be split toward a view finder optical system. In the optical path toward the view finder optical system from the mirror 56a is disposed another semi-permeable mirror 56b so that the light beam may be further split into the image reforming lens 42. 58 is the shutter in the conventional motion picture camera. As the electrical circuit 31" for processing the signals of the photoelectric transducing units 20 and 21, the electrical circuit shown in FIG. 16 is adopted similarly to the case with the photographic camera $C_2$ shown in FIG. 14.

The operation of the automatic focus adjustment equipment in the present embodiment of the motion picture camera MC is same as that of the photographic camera $C_2$ shown in FIG. 14 so that the explanation is omitted.

The above mentioned embodiments are all those of the so called passive automatic focus adjusting equipments, whereby it is requested that such passive automatic focus adjusting equipments should operate with sureness over a wide range of luminance several ten times as large. What is thought out at first as the way how to fulfill the above mentioned requirement is to automatically adjust the initial value of the intensity to be measured. Namely, the initial value is varied for example, by the offset voltage of the amplifier in the electrical circuit or by the noise voltage due to the difference in the disposition of the photoelectrical converter reacting to the contrast of the image. Hereby the signal voltage produced in the photoelectric converter reacting to the contrast of the image is necessarily small as the level for the intensity to be measured (due to the non-linear effect) so that an amplification with comparatively high factor is necessary. However, the amplification with such a high factor is of meaning only when a signal with sufficiently high S/N ratio (ratio of signal to noise) is put in the amplifier, namely the above mentioned noise voltage is sufficiently small as compared with the signal voltage to be measured which is hereby thought as the effective signal.

Below several improved embodiments in which the weight is put on the problem as to how to stabilize the initial value of the intensity to be measured in case of the amplification of the signal to be measured will be explained.

Figure 18:
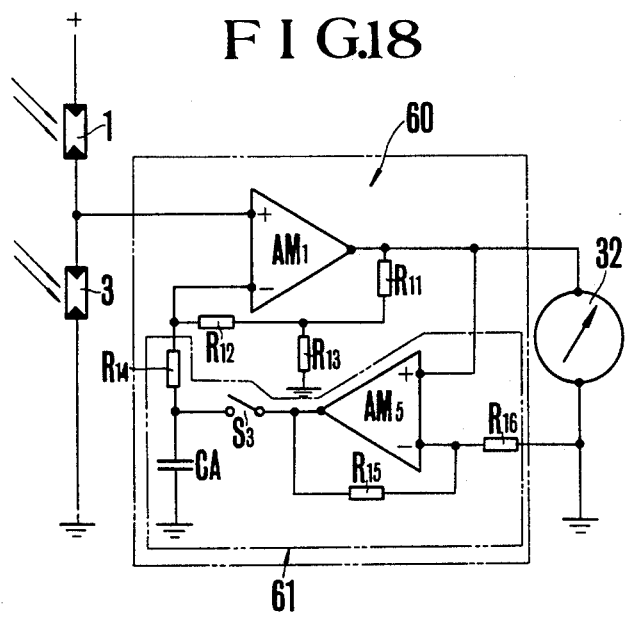
FIG. 18 shows the electrical circuit of the fundamental disposition of the signal processing circuit 60 in the optical instrument shown in FIG. 17.
Figure 17A:
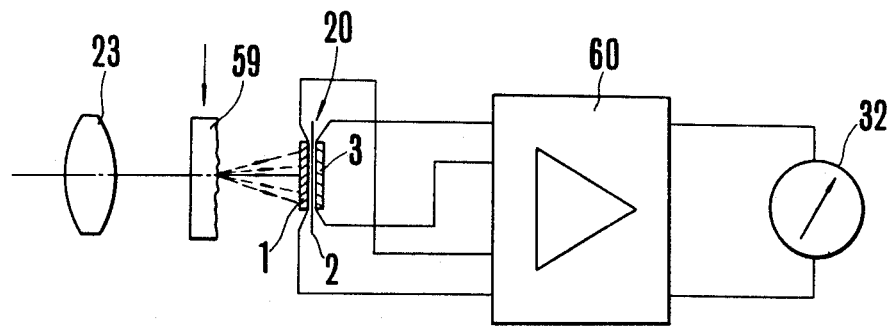
FIG. 17a and b shows in sketch the fundamental disposition of the equipment capable of automatically adjusting the initial value of the intensity to be measured in the optical instrument shown in FIG. 7.
Figure 17B:
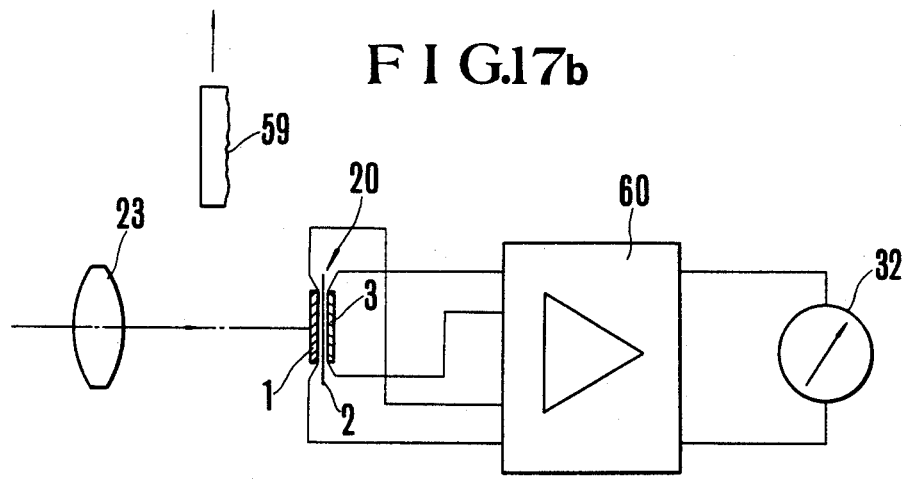

FIGS. 17a, 17b and 18 show the fundamental disposition of the equipment in which the above mentioned difficulty is tried to be overcomed by selectively inserting a diffusion plate 59 into the optical path of the objective lens 23 and the electrical circuit thereof, whereby FIG. 17a shows the state in which the diffusion plate 59 has been inserted into the optical path of the objective lens 22 while FIG. 17b shows the state in which the diffusion plate 59 has been removed out of the optical path of the objective lens 23. The disposition of this optical instrument is substantially equal to that of the equipment shown in FIG. 7. 60 is the electrical circuit for processing the signal to be processed in the photoelectrical transducing unit, whereby its details are shown in FIG. 18. The fundamental disposition of the electrical circuit shown in FIG. 18 is equal to that of the electrical circuit shown in FIG. 8, whereby in the negative feed back circuit from the output side to the inversion input side of the amplifier $AM_1$ in the circuit shown in FIG. 8, a compensating circuit 61 for automatically stabilizing the initial value is connected. This compensating circuit 61 consists of the processing amplifier $AM_5$ whose noninversion input side receives the output signal of the amplifier $AM_1$, the resistances $R_{15}$ and $R_{16}$ connected in the negative feed back circuit from the output side to the inversion input side of the above mentioned amplifier $AM_5$ for setting the amplification factor in the above mentioned amplifier $AM_5$, the switch $S_3$ connected to the output terminal of the amplifier $AM_5$, the capacitor CA connected with the switch $S_3$ for storing the signal and the resistor $R_{14}$, whereby when the switch $S_3$ is closed during the operation, the output of the amplifier $AM_5$ namely the compensating signal for stabilizing the initial value is stored in the capacitor CA and the compensating signal stored therein is put in the inversion input terminal side of the amplifier through the resistor $R_{14}$.

When the switch $S_3$ is closed the signal out, namely the output of the amplifier $AM_1$ is lowered as low as nearly 0 due to the additional large negative fed back intensity substantially formed toward the signal amplifier $AM_1$ through the amplifier $AM_5$.

This very low initial value corresponds to the state of the very low contrast of the image, whereby when the switch $S_3$ is closed the clearness of the images on the photoelectric transducers 1 and 3 is lowered remarkably by inserting the diffusion plate 59 (or another additional lens) into the optical path of the objective lens 23 as is shown in FIG. 17a and the then mean luminance almost corresponds with that when the measurement is carried out while the diffusion plate 59 is put out of the optical path of the objective lens 23 as is shown in FIG. 17b.

In this way, the automatic 0 point adjustment for the initial value of the intensity to be measured is realized for the correct mean brightness of the image, namely for the mean luminance.

FIG. 17a shows the state of the automatic adjustment of the initial value before the measurement of the sharpness of the image, whereby the diffusion plate 59 is located in the optical path of the objective lens 23 while in the circuit shown in FIG. 18 the switch $S_3$ is closed. FIG. 17b shows the state of the actual measurement of the sharpness of the image, whereby the diffusion plate 59 is located out of the optical path of the objective lens 23, while in the circuit shown in FIG. 18 the switch $S_3$ is opened and the amending signal stored in the capacitor CA is being delivered to the amplifier $AM_1$. Hereby it is preferable that the operation of the switch $S_3$ is functional engaged with the insertion and the removal of the diffusion plate 59.

The above mentioned embodiment is improved in such a manner that the diffusion plate can be mechanically put into and out of the optical path of the objective lens while below a further improved embodiment will be explained whereby in place of the diffusion plate a cell presenting a liquid crystal (or liquid layer) is adopted. FIGS. 19a and 19b shows an embodiment in case the cell 65 containing liquid crystal 63 is disposed between the objective lens 23 and the photoelectric transducing unit 20 respectively another embodiment in case the cell 65 containing liquid crystal 63 is disposed before the objective lens 23, whereby as the measuring circuit for such equipment the electrical circuit shown in FIG. 18 is used in common with the embodiment in which the above mentioned diffusion plate 59 is used.

In the drawing, the cell 65 fundamentally consists of the liquid crystal 64 and the electrodes 62 and 63, whereby the "degree of dispersion" is varied within a limited state depending upon the control voltage put between the above mentioned electrodes 62 and 63.

The liquid crystal cell 65 mounted in the optical instrument is electrically controlled in the following way.

a. When a voltage is put between the electrodes 62 and 63 the cell 65 loses it permeability, which state corresponds to that in which the diffusion plate 59 in the above mentioned embodiment is mechanically put into the optical path, when by closing the switch $S_3$ in the circuit shown in FIG. 18, an automatic level holding of the initial value can be realized similarly to the above mentioned embodiment. When further at this time, the absorption of the light beam is not large the level holding of the initial value is realized for the mean luminance similarly to the state of the automatic focus adjustment.

b. When the voltage put is removed the cell 65 resumes its permeability for the automatic focus adjustment so that the shut out of the light beam against the photoelectric transducing unit 20 is released.

Hereby, the means for controlling the putting the voltage between the electrodes 62 and 63 can be realized in the form of for example, a conventional mechanical switch contact or a switching element electrically controlled (transistor, FET etc.), whereby it is preferable that the operation of this control means should be functionally engaged with the switch $S_3$ in the circuit shown in FIG. 18.

FIGS. 20 and 21 show a fundamental disposition of an embodiment in which the principle explained in detail according to the FIGS. 17a and 17b for enabling the automatic adjustment of the initial value of the intensity to be measured in the fundamental disposition of the optical instrument shown in FIG. 12, namely the system to put the diffusion plate 59 into and out of the optical path of the objective lens 23 is adopted and the electrical circuit suited for such embodiment. The elements presenting the same figures as those of the elements shown in FIGS. 12, 16, 17a, 17b and 18, in FIG. 20 and FIG. 21 present the same disposition and the same function as those shown in the above mentioned drawings. 60'' in FIG. 20 is the electrical circuit for processing the signal to be measured of the photoelectrical transducing unit 20 and 21 so as to control the motor 52 and for enabling the automatic adjustment of the initial value of the intensity to be measured, whereby its details are shown in FIG. 21.

The electrical circuit shown in FIG. 21 presents fundamentally a similar disposition of the electrical circuit shown in FIG. 16, whereby in the negative feed back circuit from the output side of the amplifier $AM_4$ to the inversion input sides of the amplifier $AM_3$ and $AM_3'$ a compensation circuit shown with 61 as a whole in FIG. 18 is respectively connected.

The operation of the embodiment shown here is substantially equal to that of the above mentioned embodiment so that its detailed explanation will be omitted.

Further, it is essential that in case of a motion picture camera the diffusion plate 59 should be for example, the rotary wings passing through the optical path periodically whereby the switch $S_3$ should synchronously be closed.

By means of the above mentioned improvement, a sure automatic focus adjustment can be realized even for the change of the photographing scene covering a very wide range of the mean luminance.

Hereby it goes without saying that the photoelectric semiconductor composing the photosensitive layers (7, 12, 6) of the photoelectric transducer 1, 3 and 1', 3' in the above mentioned photoelectric transducing units 20 and 21 can be not only photoresistors but also for example, photo-diodes or photo-transistors.

As explained above, in detail in case of the photoelectric transducing unit, by realizing a bifilar spiral disposition of the photosensitive layers or the electrodes of a series type photoelectric transducer and a parallel type photoelectric transducer composing the above mentioned unit, it has become possible that the photosensitive layers of the above mentioned photoelectric transducers could be formed in continuation without any interruption in the photosensitive zone of the above mentioned photoelectric transducing unit. This means the enlargement of the effective photosensitive zone, the elimination of the non photosensitive zone at the central part of the light beam receiving surface of the above mentioned unit and the simplification of the photosensitive layers and the electrodes in the above mentioned unit, in which the correlative disposition of the photosensitive layers of the series type photoelectric transducer and of the parallel type photoelectric transducer is especially important, whereby in the above mentioned way, the most ideal disposition of the photosensitive layers of this kind of the photoelectric transducing unit composed of a combination of the series type photoelectric transducer and of the parallel type photoelectric transducer can be realized. Namely, this kind of the photoelectric transducing unit is utilized as detecting element for detecting the sharpness of the image of an object formed by means of the image forming optical system of an optical instrument in the embodiments of the present invention, whereby the fact that thanks to the above mentioned disposition of the photosensitive layers or of the electrode there exists no non photosensitive zone especially at the central part of the light beam receiving surface of the above mentioned unit is very profitable when for example, the above mentioned optical instrument is a camera because at taking photograph it is usual that the central part of the object is focussed in such a manner that in case of the above mentioned unit, the central part of the light receiving surface is made to correspond with the central part of the above mentioned object to be photographed. Further, thanks to the above mentioned disposition of the photosensitive layers or of the electrodes, it is possible to form a photosensitive layer effective for such an object the pattern of whose dark and bright part is very complicated, without any complicated modification, whereby not only the electrodes connected to the photosensitive layer as well as the terminals connected to the electrodes of the series type photoelectric transducer but also the terminals connected to the electrodes of the parallel type photoelectric transducer can be located outside of the effective light beam receiving surface of the photoelectric transducer so that the photosensitive zone of the above mentioned unit is all the more enlarged which is very profitable.

Thus the object image sharpness detecting system according to the present invention, in which a photoelectric transducing unit presenting above mentioned features and advantages is able to detect the variation of the sharpness of the object image with very high accuracy.

Although in the attached drawings of the embodiments only rectangular spiral photosensitive layers or electrodes of the above mentioned photoelectric transducer are shown, the form can be for example circular. Various variations of the form according to design are easily possible.

What is claimed is:

1. A light-to electrical signal conversion unit, comprising;
    electrical insulation means permitting the passage of light therethrough,
    first photoelectric transucing means including;
    a pair of strip-shaped electrode members each having two long edges and two short edges smaller than the long edges, each of said electrode members being disposed over an area of said insulating means so that the member never crosses itself, one of the short edges of each member being disposed near the center of the area, said members being bifilar wound relative to each other over the area, the other short edge on each member being disposed at the outside of the area,
    a first photosensitive element disposed between said bifilar wound members,
    second photoelectric transducing means disposed on said insulating means over a second area opposing the first photoelectric transducing means, said second photoelectric transducing means including;
    a belt-shaped second photosensitive element having two long edges and two short edges smaller than the long edges, said long edges having central portions, said element being folded so that the central portions are situated nearly at the center of the second area and being wound bifilarly over the second area similarly to said first photoelectic transducing means, the shorted edges being situated outside of the second area,
    a pair of electrode pieces, each of said pieces being connected to each of said shorter edges.

2. A unit according to claim 1, in which said photosensitive element of said second photoelectric transducing means overlies said pair of the electrode members of said first photoelectric transducing means but lies wholly between said photosensitive element of said first photoelectric transducing means except at the center of the first area between short edges of said pair of the electrode member of said first photoelectric transducing means.

3. A unit according to claim 2, in which said first photoelectric tranducing means includes first holding means for holding said first photosensitive element while said second photoelectric transducing means includes the second holding means for holding the second photosensitive element, said holding means each having a surface opposing said insulating means, the photosensitive elements in said first and said second photoelectric transducing means being respectively disposed on the surface opposed to said insulation means.

4. A unit according to claim 3, in which said second holding means permits the passage of the light while said first holding means prevents the the light beam from influencing said photosensitive element of said second photoelectric transducing means from a surface reversed to the surface opposed to said insulation means.

5. A unit according to claim 4, in which at least one of said photosensitive elements of said first and said second photoelectric transducing means is formed of CdS.

6. A unit according to claim 5, in which at least one of said photosensitive elements of said first and said second photoelectric transducing means is vapor deposited on said holding means.

7. A unit according to claim 4, in which said electrode members of said first photoelectric transducing means are vapor deposited on said holding means.

8. A unit according to claim 1, in which said insulation means contains adhesive means.

9. A unit according to claim 1, in which at least one of said first photosensitive elements and of said second photosensitive elements permits passage of light.

10. A unit according to claim 9, in which said said second photosensitive elements permits the passage of light and overlies said pair of said electrode pieces of said first photoelectric transducing means but to overlap only said photoelectric semiconductor of said first photosensitive elements.

11. A unit according to claim 10, in which said first photosensitive elements permits the passage of light.

12. A unit according to claim 10, in which said unit is formed so that when light entering said first photoelectric transducing means passes through said insulation means and said second photoelectric transducing means, the light coming out of said second photoelectric transducing means is substantially uniform no matter through which part the light passes.

13. A unit according to claim 9, in which said first photoelectric transducing means includes first holding means for said first photosensitive elements while said second photoelectric transducing means includes second holding means for said second photosensitive elements, said holding means each having a surface opposing said insulating means, said first and said second photosensitive elements being respectively disposed on a surface opposed to said insulation means.

14. A unit according to claim 1, wherein said first and second photoelectric transducing means have non-linear electrical response characteristics with respect to the change in sharpness of an image to be formed thereon.

15. A unit according to claim 14, wherein said first and second photoelectric transducing means have mutually different electrical response characteristics with respect to the change in the sharpness of the image.

16. A unit according to claim 15, wherein said first photoelectric transducing means has a non-linear electrical response characteristic such that its output is increased with increase in the sharpness of the image and said second photoelectric transducing means has a non-linear electrical response characteristic such that its output is decreased with increase in the sharpness of the image.

17. A unit according to claim 14, wherein said first and second photoelectric transducing means have mutually different nonlinear resistance versus image sharpness response characteristics.

18. A unit according to claim 17, wherein said first photoelectric transducing means has a non-linear resistance characteristic such that the internal resistance value thereof decreases with increase in the sharpness of the image and said second photoelectric transducing means has a non-linear resistance value thereof increases with increase in the sharpness of the image.

19. An object image sharpness detecting system for detecting the sharpness of the image formed by the image forming optical system comprising;
 I. a light-to-electrical signal converting unit disposed substantially at the image forming position of said optical system,
 II. a detecting means for detecting the sharpness of the object image by detecting the variation of the electrical output of said light-to-electrical signal converting unit,
 III. said converting unit including
 III A. insulation means
 III B. first and second photoelectric transducing means disposed on both sides of the insulation means and permitting the passage of a light beam,
 IV. said first photoelectric transducing means electrically connected to said detecting means comprising;
 IV A. a pair of belt-shaped electrode members having respective ends and disposed in such a manner that they do not cross each other and are wound in a bifilar winding which forms a center so that the one of the ends of each member is located near the center while the other end is located at the outside of the bifilar winding,
 IV B. a photoelectric semiconductor dispersed at least in the space of said bifilar winding formed by said both electrode pieces,
 V. said second photoelectric transducing means electrically connected to said detecting means comprising;
 V A. a belt-shaped photoconductive element folded back to form a middle located near the center and wound to form a bifilar winding, both of said ends being located external to the bifilar winding,
 V B. a pair of the electrodes being connected respectively to said ends, whereby the sharpness of the object image is detected by detecting the output of the light-to-electrical signal converting unit.

20. A system according to claim 19, in which said photoconductive element of said second photoelectric transducing means overlaps said pair of the electrode pieces of said first photoelectric means but does not overlap said photoelectric semiconductor of said first photoelectric transducing means excepting at the center of the bifilar part formed by said pair of the electrode pieces of said first photoelectric transducing means.

21. A system according to claim 20, in which said first photoelectric transducing means includes first photoconductive element holding means while said second photoelectric transducing means includes second photoconductive element holding means, whereby said photoelectric semiconductors of said first and said second photoelectric transducing means are respectively disposed on the surfaces opposed to said insulation means of said photoconductive element holding means.

22. A system according to claim 20, in which said second photoconductive element holding means is formed so as to permit the passage of a light beam while said first photoelectric semiconductor holding means is formed so as to prevent said photoconductive element of said second photoelectric transducing means from being influence by the light beam from the surface opposite the surface facing to said insulation means.

23. A system according to claim 19, in which at least one of said photoconductive elements of said first and said second photoelectric transducing means is formed of CdS.

24. A system according to claim 19, in which said detecting means includes processing circuit means for comparing the output of said first photoelectric transducing means with that of said second photoelectric transducing means so as to produce as output an electrical signal corresponding to the comparison signal.

25. A system according to claim 24, in which said detecting means includes a compensating means for compensating the output of said processing circuit means in accordance with the light intensity of the object.

26. A system according to claim 25, wherein said compensating means includes operating circuit means coupled to said processing circuit means for detecting the light intensity on the basis of an output of said processing circuit means when said converting unit receives a diffused light beam.

27. A system according to claim 26, wherein said compensating means further comprises signal storing means coupled to said operating circuit means and said processing circuit means for storing an output signal of said operating circuit means and supplying said output signal to said processing circuit means.

28. A system according to claim 26, further comprises a light beam diffusion means selectively disposed between said image forming optical system and said light-to-electrical signal converting unit for diffusing the image passing through the image forming optical system over said unit, said operating circuit means detecting the light intensity on the basis of an output of said processing circuit means when said diffusion means is disposed between said optical system and said converting unit.

29. A system according to claim 26, further comprising a light diffusion means normally disposed between said image forming optical system and said light-to-electrical signal converting unit containing a liquid crystal layer, said light beam diffusion means selectively diffusing or retaining the image through said image forming optical system over the unit, said operating circuit means detecting the light intensity on the basis of an output of said processing circuit means said converting unit receives a light beam diffused by said liquid crystal layer.

30. A system according to claim 19, wherein at least a part of said image forming optical system is movable along an optical axis in order to change the image sharpness on said converting unit.

31. A system according to claim 30, further comprising indicating means electrically connected with said detecting means for indicating the degree of the image sharpness on the basis of an output of said detecting means.

32. A system according to claim 30, further comprising driving means electrically connected with said detecting means and operatively coupled with said movable part of said optical system for moving said movable part of said optical system along the axis on the basis of an output of said detecting means.

33. An image sharpness detecting system cooperating with an image forming optical system to detect an optimum degree of sharpness of an image projected thereby from an object comprising:
  at least a pair of light-to electrical signal converting units disposed before and behind the image forming position of said image forming optical system,
  a detecting means for detecting the sharpness of the image of an object by detecting the variation of the electrical output of said pair of the light-to-electrical signal converting unit,
  insulating means
  first and the second photosensitive elements disposed on the insulating means opposed to each other;
  said first photoelectric converting means electrically connected to said detecting means and comprising;
  a pair of belt-shaped electrode members having short and long edges, the short edges being shorter than the longer edges, said members being disposed so that the electrode members do not contact each other and form an area having a center, the short edges being located near the center, the electrode members being wound bifilarly and the other shorter edges being located external to the area,
  a photosensitive element disposed at least in the space of said bifilar part formed by said both electrode pieces,
  said second photoelectric converting means electrically connected to said detecting means and comprising;
  a belt-shaped photosensitive element having long and short sides and a middle, the short sides being shorter than the long sides, the photosensitive element being folded over a space having a center so that the middle of the long sides is located nearly at the center, said semiconductor being wound bifilarly similar to said first photoelectric transducing means and the both shorter sides being located external to the space,
  a pair of the electrode pieces being connected to said both shorter bases,
  said detecting means detecting the output of the light-to-electrical signal converting unit, said unit being disposed so that an element is also disposed near the center of said first and said second photoelectric converting means.

34. A system according to claim 33, in which light splitting means between said optical system and said pair of the light-to-electrical signal converting units split the optical axis of said optical system at least into the first and the second axis and said light-to-electrical signal converting units are separately disposed on said first and said second optical axis.

35. A system according to claim 34, in which said photosensitive element of said second photoelectric converting means overlaps said pair of the electrode pieces of said first photoelectric means but does not overlap said photosensitive element of said first photoelectric converting means except at the center of the bifilar part formed by said pair of the electrode pieces of said first photoelectric converting means.

36. A system according to claim 35, in which said first photoelectric transducing means includes first photosensitive element holding means while said second photoelectric converting means includes second photosensitive element holding means, whereby said photosensitive elements of said first and said second photoelectric converting means are respectively disposed on the surfaces facing said insulation means of said photosensitive element holding means.

37. A system according to claim 36, in which said second photosensitive element holding means permits passage of light while said first photosensitive element holding means is so formed so as to prevent said semiconductive element of said second photoelectric converting means from being influenced by light from the surface opposing the surface facing said insulation means.

38. A system according to claim 30, in which at least one of said semiconductive elements of said first and said second photoelectric converting means is formed of CdS.

39. A system according to claim 33, in which said detecting means includes a differential amplifier means for comparing the output of said first photoelectric converting means with the output of said second photoelectric transducing means so as to produce as output an electrical signal in accordance with the comparison signal.

40. A system according to claim 39, in which said differential amplifier means contains a processing circuit.

41. A system according to claim 33, in which said pair of the light-to-electrical signal converting units are disposed on the optical axis of said optical system.

42. A system according to claim 41, in which the first light-to-electrical signal converting unit is disposed in such a manner that said photosensitive element of said second photoelectric converting means permits the passage of the light beam and overlaps only the photoelectric semiconductor of said first photoelectric transducing means and lies substantially wholly between said pair of the electrode pieces of said first photoelectric transducing means.

43. A system according to claim 42, in which said first light-to-electrical signal converting unit permits the passage of the light beam while when the light beam entering into said first photoelectric converting means passes through said insulation means and said second photoelectric converting means, the light beam coming out of said second photoelectric converting means is substantially uniform no matter through which part the light beam passes.

44. A system according to claim 43, in which the second light-to-electrical signal converting unit is disposed so that said photosensitive element of said second photoelectric converting means overlaps said pair of the electrode pieces of said first photoelectric converting means but does not overlap the photosensitive element of said first photoelectric converting means excepting at the center of the bifilar part formed by said pairs of the electrode pieces of said first photoelectric converting means.

45. A system according to claim 33, further comprising a beam splitting means arranged between said optical system and a plane substantially in the image plane in the optical path of said optical system to split an image-forming light beam entering said optical system into at least two portions, said converting units being arranged to receive respective ones of two beam portions split by said beam splitting means.

46. A system according to claim 33, wherein each of said first and second photoelectric transducing means of said converting units have non-linear electrical response characteristics with respect to the change in image sharpness.

47. A system according to claim 39, wherein said operational amplifier means comprises at least two operational amplifying circuits, and said converting units are each respectively connected with one of said amplifying circuits.

48. A system according to claim 42, wherein said detecting means further comprises differential amplifier means electrically connected with said operational amplifying circuits.

49. A system according to claim 48, wherein said detecting means further comprises compensating means for compensating the output of said differential amplifier means in accordance with the intensity of the light beam of image.

50. A system according to claim 49, wherein said compensating means comprises an operating circuit means coupled to said differential amplifier means for detecting the light intensity on the basis of an output of said differential amplifier means when said converting unit receives a diffused light beam.

51. A system according to claim 50, wherein said compensating means further comprises a signal storing means electrically coupled with both said operating circuit means and said operational amplifier means for storing an output signal of said operating circuit means and supplying said output signal to said operational amplifier means.

52. A system according to claim 51, further comprises a light beam diffusion means selectively disposed between said image forming optical system and said light-to-electrical signal converting unit so as to diffuse the image passing through said image forming optical system over said unit, said operating circuit means detecting the light intensity on the basis of an output of said differential amplifier means when said diffusion means is disposed between said optical system and said converting unit.

53. A system according to claim 51, further comprising light diffusion means normally disposed between said image forming optical system and said light-to-electrical signal converting unit and containing a liquid crystal layer, said light beam diffusion means selectively diffusing or passing the image coming through said image forming optical system over the unit, said operating circuit means detecting the light intensity on the basis of an output of said differential amplifier means when said converting unit receives the diffused light beam diffused by said liquid crystal layer.

54. A system according to claim 53, wherein each of said first and second photoelectrical transducing means of said converting units exhibit non-linear electrical response characteristics whose internal resistance values thereof reach a peak value when the sharpness of the image to be formed thereon reaches a maximum.

55. A light-to-electrical signal converting unit comprising;
  I. first photoelectric transducing means having;
    1a. a first photosensitive element forming a current path and having shorter and longer sides, the length of the shorter sides being substantially shorter than the length of the longer sides, and
    1b. a first pair of electrodes each contacting a respective longer side of said first photosensitive element along the entire length thereof, and
  II. second photoelectric transducing means having;
    IIa. a transparent substrate,
    IIb. a second photosensitive element formed on said substrate and having shorter and longer sides, the length of the shorter side being substantially shorter than the longer sides, and
    IIc. a second pair of electrodes each contacting a respective shorter sides of said second photosensitive element,
  III. said first and second photoelectric transducing means having mutually different non-linear electrical response characteristics with respect to change in sharpness of an image to be formed thereon,
  IV. said first pair of electrodes having a geometry substantially identical with that of the second photosensitive element, and
  V. said first photoelectric transducing means overlying said second photoelectric transducing means so that said second photosensitive element is in registry with the first pair of electrodes.

56. A unit according to claim 55, wherein said electrical response characteristic of both said first and second photoelectric transducing means has a peak value when the sharpness of the image to be formed thereon becomes maximum.

57. A unit according to claim 56, wherein said first photoelectric transducing means has a non-linear electrical response characteristic whose output increases with increasing sharpness of the image and said second photoelectric transducing means has a non-linear electrical response characteristic whose output decreases with increasing sharpness of the image.

58. A unit according to claim 55, wherein said first and second photosensitive elements are composed of photoconductive material.

59. A unit according to claim 58, wherein said first and second photoelectric transducing means have electrical response characteristics whose internal resistance values thereof reach a peak value when the sharpness of an image to be formed thereon becomes maximum.

60. A unit according to claim 59, wherein said first photoelectric transducing means has a non-linear resistance characteristic with an internal resistance value that decreases with increasing image sharpness, and said second photoelectric transducing means has a non-linear resistance characteristic with an internal resistance value that increases with increasing image sharpness.

61. A unit according to claim 55, wherein said second photosensitive element exhibits a bifilar-spiral form on said substrate with the center portion of the spiral coinciding substantially with the center portion of said substrate.

62. An image sharpness detecting system cooperating with an image-forming optical system to detect an optimum degree of sharpness of an image projected thereby from an object comprising;

a light-to-electrical signal converting unit positioned substantially at the focus of said optical system, and detecting means coupled to said converting unit for detecting the optimum degree of said object image on the basis of electrical output of said converting unit, said light-to-electrical signal converting unit including first photoelectric transducing means having a first non-linear electrical response characteristic, and having a first photosensitive element forming a current path, said element having shorter and longer sides, the length of the shorter sides being substantially shorter than the length of the longer sides, said first photoelectric transducing means having a first pair of electrodes each contacting a respective longer sides of said first photosensitive element along the entire length of the side, said converting unit further including second photoelectric transducing means having a second non-linear electrical response characteristic different from said first non-linear electrical response characteristic and having a transparent substrate as well as a second photosensitive element formed thereon on the substrate, said second photosensitive element having shorter and longer sides, the length of the shorter side being substantially shorter than the longer sides, said photoelectric transducing means having a second pair of electrodes contacting the respective shorter sides of said second photosensitive element along the entire length thereof, said first pair of electrodes haing a geometry substantially identical to that of the second photosensitive element, and said first photoelectric transducing means being arranged adjacent said second photoelectric transducing means so that second photosensitive element is in alignment with the first pair of electrodes.

63. A system according to claim 62, wherein said second photosensitive element exhibits a bifilar-spiral form on said substrate with the center portion of the spiral coinciding substantially with the center portion of said substrate.

64. A system according to claim 63, wherein said first and second photosensitive elements are composed of photoconductive material.

65. A system according to claim 64, wherein said first photoelectric transducing means has an internal resistance value that decreases with increasing image sharpness, and said second photoelectric transducing means has an internal resistance value that increases with increasing image sharpness.

* * * * *

UNITED STATES PATENT OFFICE
CERTIFICATE OF CORRECTION

Patent No. 4,019,049    Dated April 19, 1977

Inventor(s) Hansrichard Schulz

It is certified that error appears in the above-identified patent and that said Letters Patent are hereby corrected as shown below:

In the heading of the patent [30] should read as follows:

—[30]  February 8, 1974  Germany......... 24 06 045
        February 14, 1974  Germany......... 24 07 105
        February 18, 1974  Germany......... 24 07 639  —.

Signed and Sealed this second Day of August 1977

[SEAL]

Attest:

RUTH C. MASON
*Attesting Officer*

C. MARSHALL DANN
*Commissioner of Patents and Trademarks*